United States Patent
Suzuki et al.

(10) Patent No.: US 7,755,089 B2
(45) Date of Patent: Jul. 13, 2010

(54) SEMICONDUCTOR DEVICE INCLUDING COMPLEMENTARY MOS TRANSISTOR HAVING A STRAINED SI CHANNEL

(75) Inventors: Masamichi Suzuki, Yokohama (JP); Masato Koyama, Miura-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 11/858,408

(22) Filed: Sep. 20, 2007

(65) Prior Publication Data
US 2008/0224226 A1  Sep. 18, 2008

(30) Foreign Application Priority Data
Mar. 15, 2007  (JP) .............................. 2007-067171

(51) Int. Cl.
*H01L 31/112* (2006.01)
(52) U.S. Cl. ................... 257/69; 257/274; 257/206; 257/204
(58) Field of Classification Search ................... 257/69, 257/274, 206, 204
See application file for complete search history.

(56) References Cited

U.S. PATENT DOCUMENTS

| | | | |
|---|---|---|---|
| 6,380,057 B1* | 4/2002 | Buynoski et al. ............ | 438/592 |
| 6,445,016 B1* | 9/2002 | An et al. ..................... | 257/192 |
| 7,091,561 B2 | 8/2006 | Matsushita et al. | |
| 2002/0137250 A1* | 9/2002 | Nguyen et al. ................ | 438/53 |
| 2003/0040158 A1* | 2/2003 | Saitoh ......................... | 438/279 |
| 2006/0008958 A1* | 1/2006 | Yeo et al. .................... | 438/187 |
| 2006/0237837 A1 | 6/2006 | Matsushita et al. | |
| 2006/0246651 A1* | 11/2006 | Chambers et al. ........... | 438/216 |

FOREIGN PATENT DOCUMENTS

JP  2001-24188  1/2001

(Continued)

OTHER PUBLICATIONS

Machine Translation of JP 2001-024188.*

(Continued)

*Primary Examiner*—A. Sefer
*Assistant Examiner*—Allen L Parker
(74) *Attorney, Agent, or Firm*—Oblon, Spivak, McClelland, Maier & Neustadt, L.L.P.

(57) ABSTRACT

A semiconductor device includes a semiconductor substrate, p-type first and n-type second semiconductor regions formed on the substrate so as to be insulated with each other, n-channel and p-channel MOS transistors formed on the first and second semiconductor regions, the n-channel transistor including a first pair of source/drain regions formed on the first semiconductor region, a first gate insulator formed in direct contact with the first semiconductor region and formed as an amorphous insulator containing at least La, and a first gate electrode formed on the first gate insulator, the p-channel MOS transistor including a second pair of source/drain regions formed opposite to each other on the second semiconductor region, a second gate insulator including a silicon oxide film and the amorphous insulating film formed thereon on the second semiconductor region, and a second gate electrode formed on the second gate insulator.

20 Claims, 17 Drawing Sheets

FOREIGN PATENT DOCUMENTS

| | | |
|---|---|---|
| JP | 2003-60076 | 2/2003 |
| JP | 2003-188275 | 7/2003 |
| JP | 2004-214386 | 7/2004 |
| JP | 2005-534163 | 11/2005 |
| JP | 2006-173432 | 6/2006 |
| JP | 2006-344713 | 12/2006 |
| JP | 2006-351581 | 12/2006 |

OTHER PUBLICATIONS

U.S. Appl. No. 12/133,583, filed Jun. 5, 2008, Koyama, et al.

Masamichi Suzuki, et al., "Ultra-thin (EOT=3Å) and low leakage dielectrics of La-alminate directly on Si substrate fabricated by high temperature deposition", Technical Digest IEDM, 2005, 4 pages.

M. Suzuki, et al., "Characterization of Si(100)/HfSiON interface", Nuclear Instruments and Methods in Physics Research B 219-220, Available online at www.sciencedirect.com, 2004, pp. 851-855.

* cited by examiner

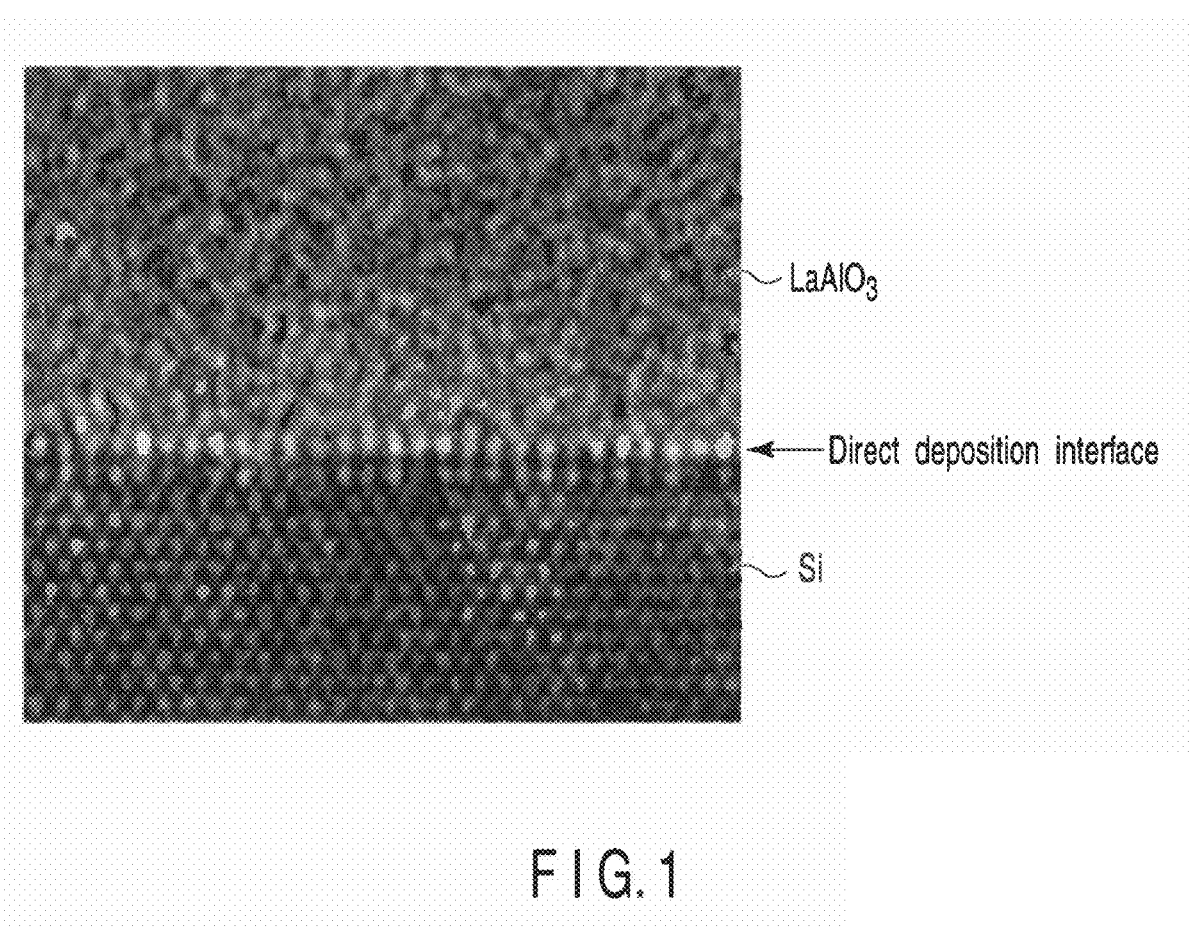
F I G. 1

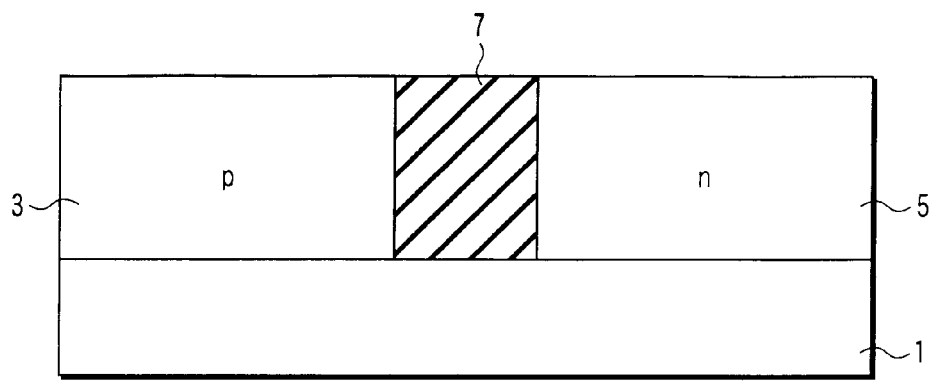
F I G. 8
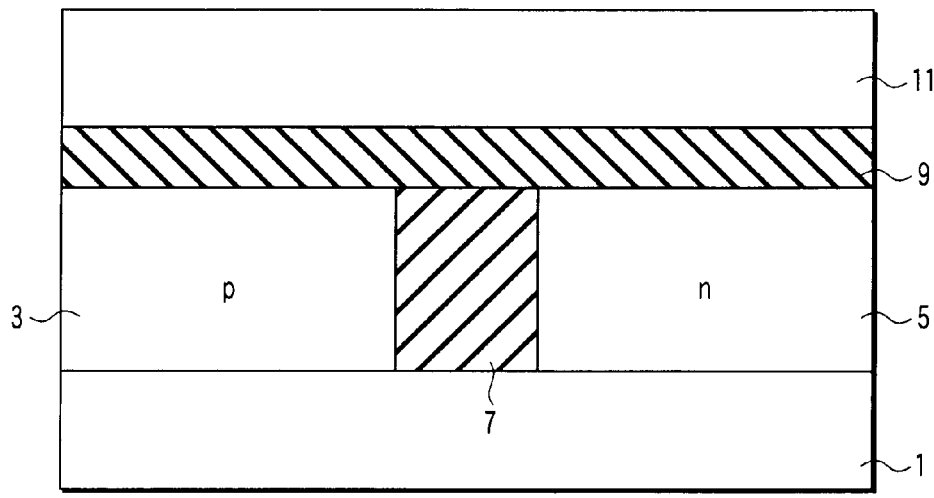
F I G. 9
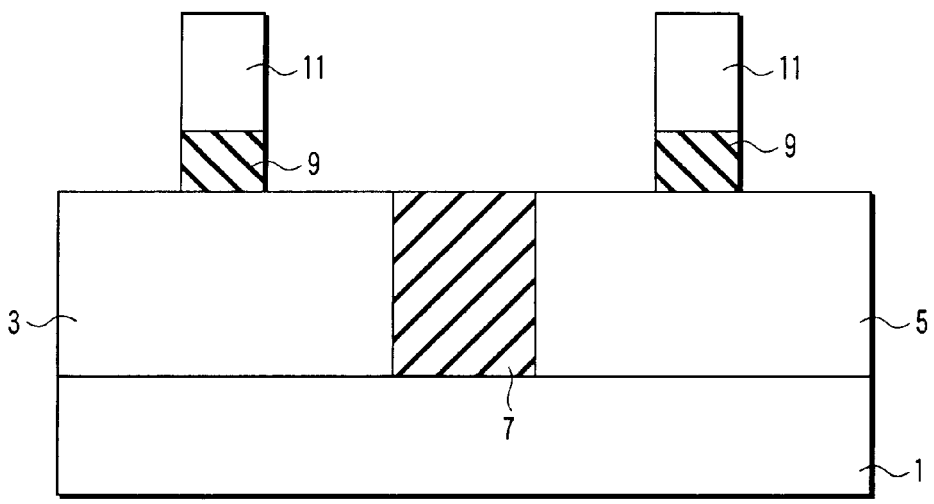
F I G. 10

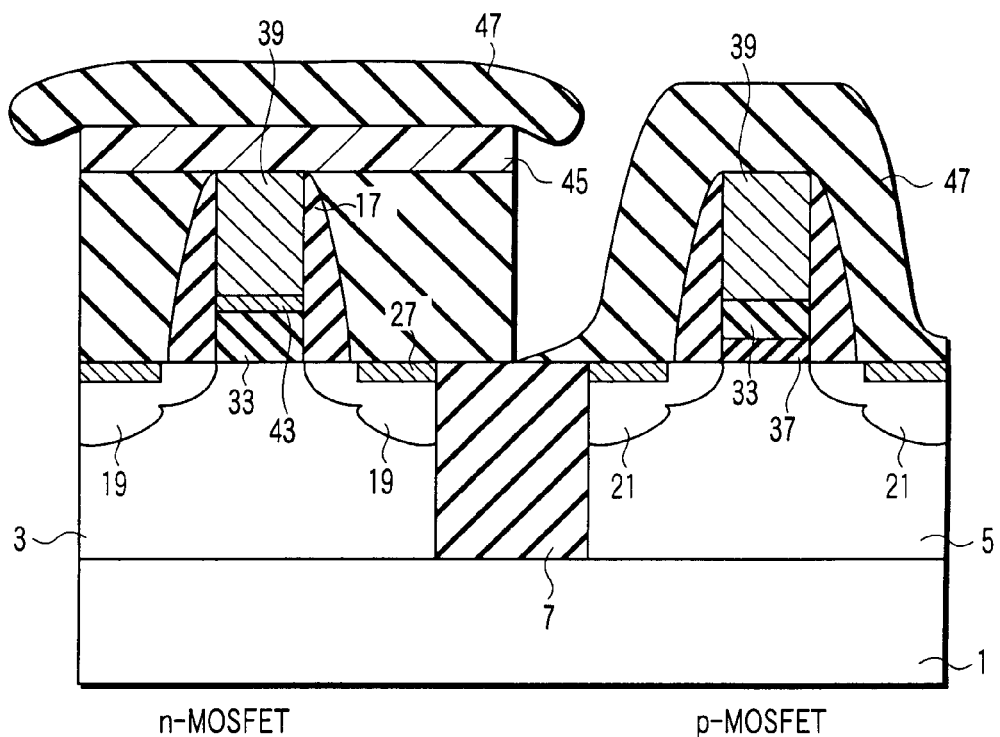
F I G. 23
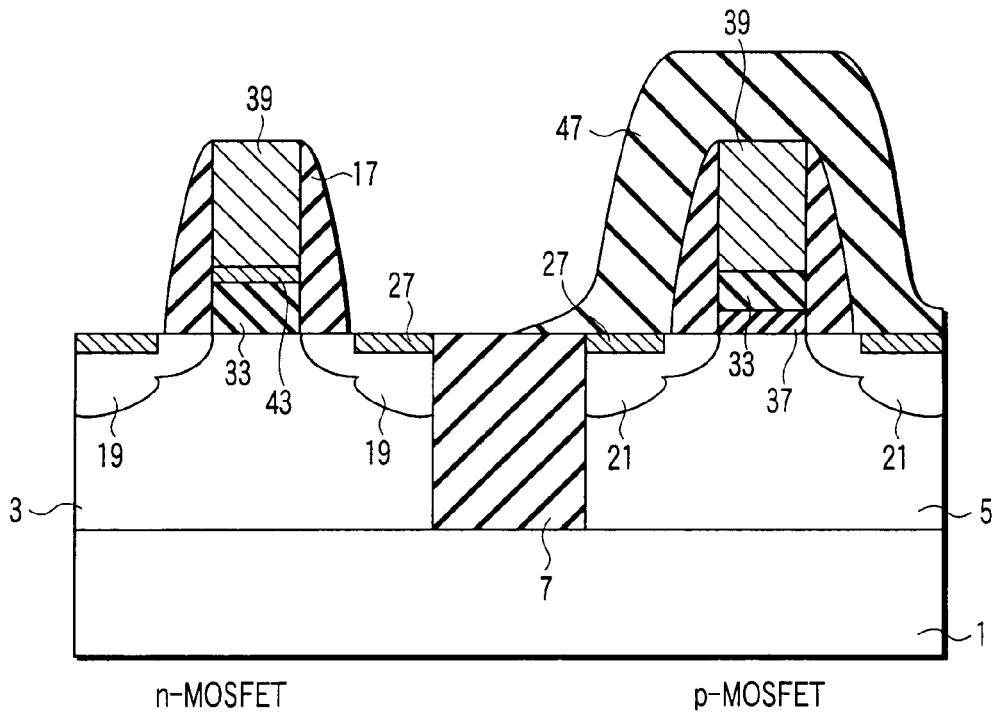
F I G. 24

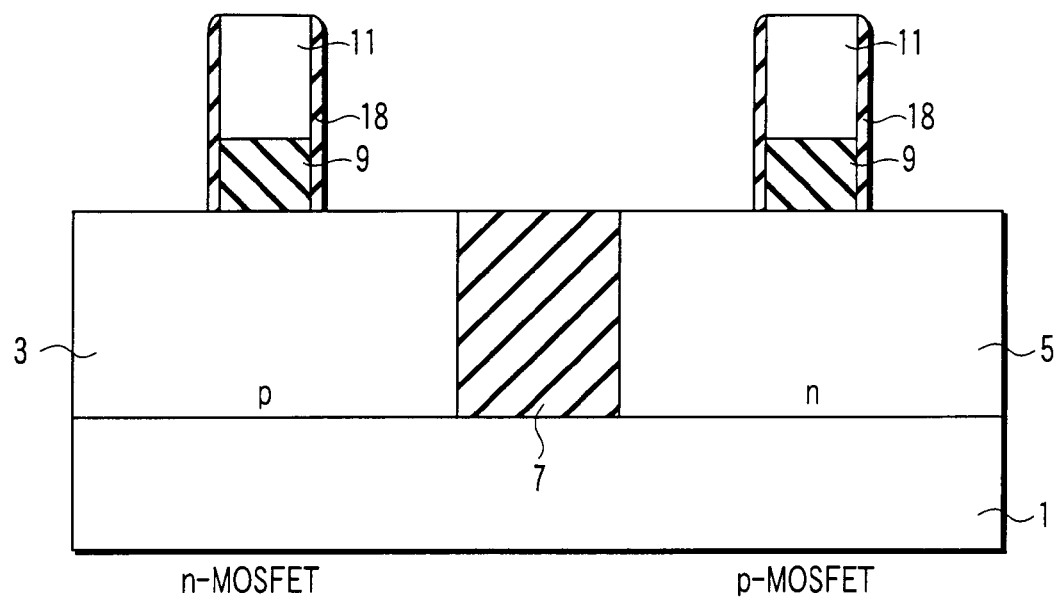
F I G. 27
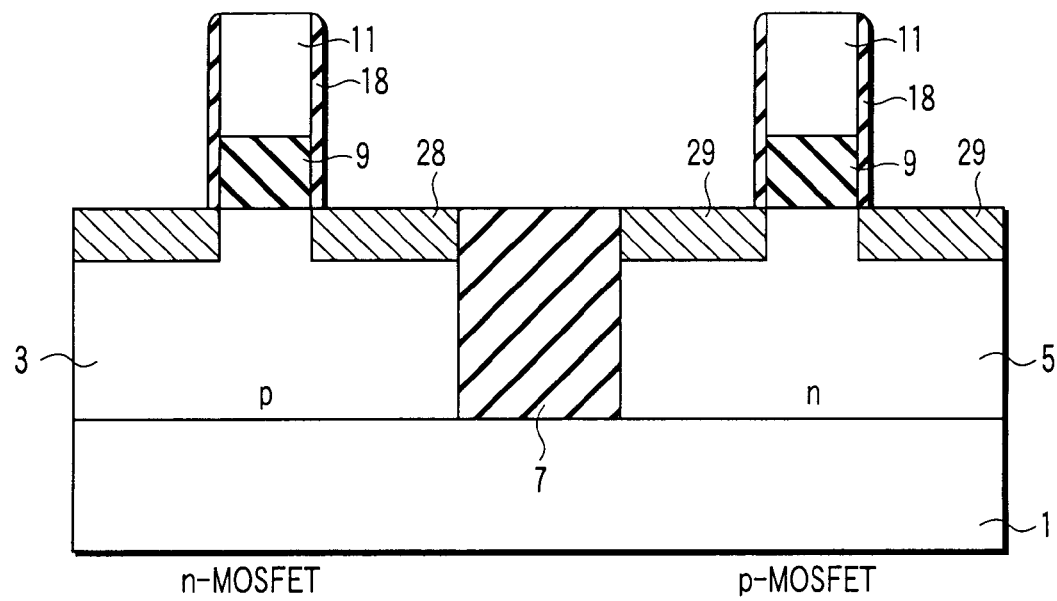
F I G. 28

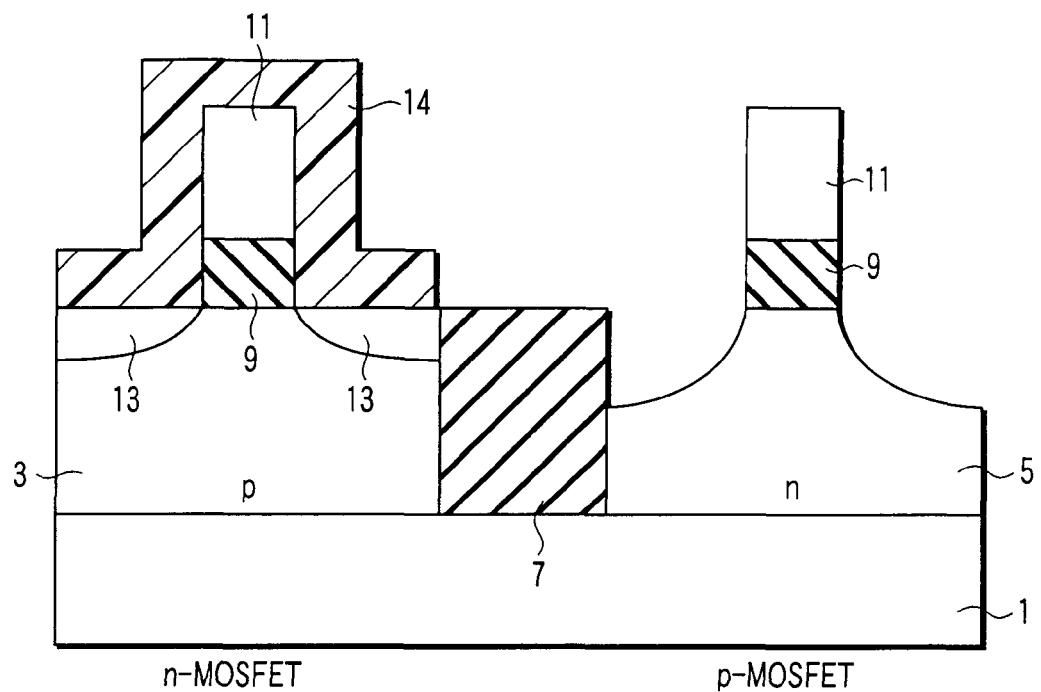
F I G. 31
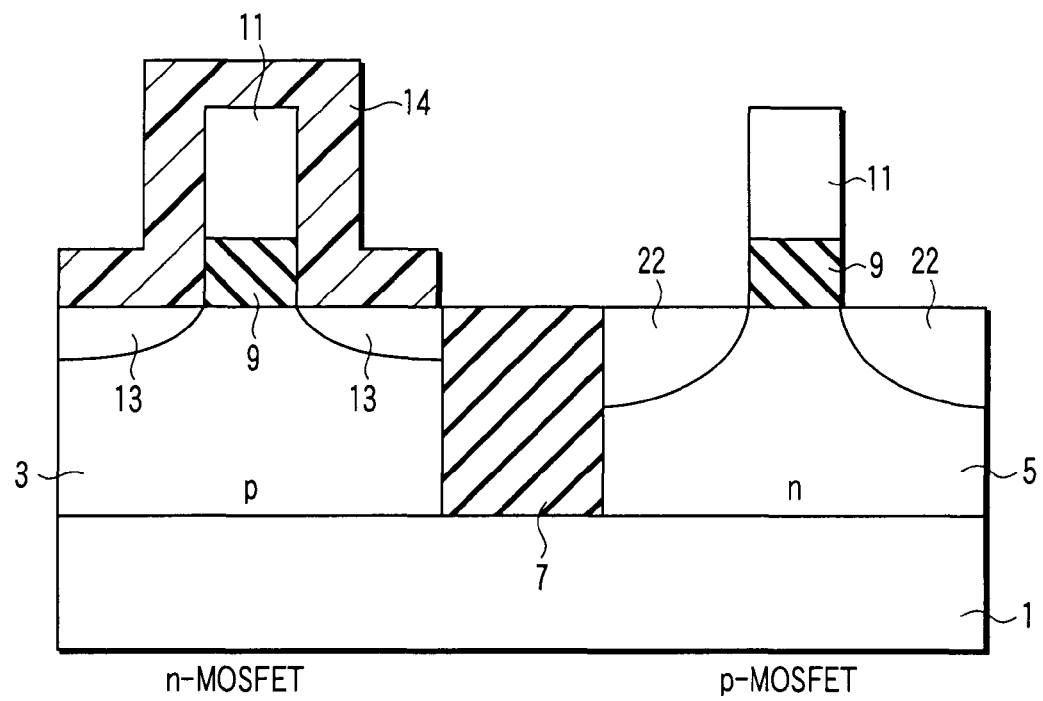
F I G. 32

SEMICONDUCTOR DEVICE INCLUDING COMPLEMENTARY MOS TRANSISTOR HAVING A STRAINED SI CHANNEL

CROSS-REFERENCE TO RELATED APPLICATIONS

This application is based upon and claims the benefit of priority from prior Japanese Patent Application No. 2007-067171, filed Mar. 15, 2007, the entire contents of which are incorporated herein by reference.

BACKGROUND OF THE INVENTION

1. Field of the Invention

The present invention relates to a complementary MOS transistor having a strained Si channel.

2. Description of the Related Art

The advancement of an Si-LSI device has been achieved with the enhancement of the performance of a MOS transistor which is a basic unit of the Si-LSI device. As the performance of the MOS transistor is closely related to the mobility of a carrier (electron, hole) traveling in a channel, attention has been paid to techniques for improving the carrier mobility. One technique for improving the mobility is a strained Si technique. For example, an Si layer is formed on a strain-relaxed SiGe layer to apply tensile strain to Si of a channel in an n-channel MOS transistor, while a gate electrode is coated with a stressor made of a SiN film to improve the electron mobility in a p-channel MOS transistor.

However, in the case of, for example, the method in which the Si layer is formed on the strain-relaxed SiGe layer, the dislocation density of the surface of the relaxed SiGe layer is high, leading to problems such as the increase of a leakage current. Further, in the case of the method which coats with the stressor made of the SiN film, the process of manufacturing an FET is naturally complicated, and the amount of strain changes with the change of the FET in size, so that, for example, redesigning is required to change the thickness of the SiN film to adjust the amount of strain, and there arises a problem that the film comes off if the thickness of the SiN film is too large.

Furthermore, in JP-A 2004-214386 (KOKAI), a crystalline metal oxide insulating film having lattice spacing different from that of a substrate is formed as a gate insulating film on a channel to modulate the lattice spacing of a channel area, such that the mobility of the carrier is improved.

Here, there is concern over the increase of the leakage current when the gate insulating film is polycrystalline. In addition, according to the above-mentioned patent publication, the Si substrate substantially uniformly contains an amount of strain of about 0.7% in an area up to 50 nm from an interface because the gate insulating film is an epitaxial film. When such an amount of strain exists over 50 nm or more, there is concern over the susceptibility to mechanical shocks such that device characteristics might deteriorate due to the relaxation of strain by the occurrence of a dislocation, that is, a crystal defect caused by a small shock. Moreover, the variation between devices increases.

Furthermore, for the manufacture of the n- and p-channel MOS transistors, the gate insulating films made of materials of different kinds have to be used to apply tensile and compressive strain to the channels, so that the process of manufacturing a complementary MOS transistor is extremely complicated.

BRIEF SUMMARY OF THE INVENTION

According to one aspect of the invention, there is provided a semiconductor device, which included:

a semiconductor substrate;

a p-type first semiconductor region formed on the semiconductor substrate;

an n-type second semiconductor region formed on the semiconductor substrate so as to be insulated from the first semiconductor region;

an n-channel MOS transistor formed on the first semiconductor region; and a p-channel MOS transistor formed on the second semiconductor region, the n-channel MOS transistor including:

a first pair of source/drain regions formed opposite to each other on the first semiconductor region;

a first gate insulating film formed in direct contact with the first semiconductor region interposed between the first pair of source/drain regions and formed as an amorphous insulating film containing at least La; and a first gate electrode formed on the first gate insulating film, the p-channel MOS transistor including:

a second pair of source/drain regions formed opposite to each other on the second semiconductor region;

a second gate insulating film including a silicon oxide film and the amorphous insulating film formed thereon, and formed on the second semiconductor region interposed between the second pair of source/drain regions; and a second gate electrode formed on the second gate insulating film.

BRIEF DESCRIPTION OF THE SEVERAL VIEWS OF THE DRAWING

FIG. 1 is a diagram showing an $LaAlO_3$ film directly deposited on an Si substrate;

FIGS. 8 to 24 are sectional views for the stepwise explanation of the process of manufacturing the semiconductor device in the first embodiment;

FIGS. 26 to 29 are sectional views for the stepwise explanation of a method of manufacturing the semiconductor device in the second embodiment;

FIGS. 31 to 33 are sectional views for the stepwise explanation of a method of manufacturing the semiconductor device in the third embodiment.

DETAILED DESCRIPTION OF THE INVENTION

Before describing embodiments, there is explained on the basis of the knowledge of the present inventors a phenomenon in which an LaAlO$_3$ film directly deposited on an Si substrate provides tensile strain to the Si substrate. FIG. 1 is a sectional transmission electron microscopy (TEM) photograph wherein an LaAlO$_3$ film is deposited, by the pulsed laser deposition method in which an LaAlO$_3$ single crystal substrate was used as a target material, on a silicon substrate from which native oxide is removed by a diluted HF treatment. It can be recognized from FIG. 1 that the LaAlO$_3$ film is amorphous. When an interface layer made of Si oxide such as SiO$_2$ is present between the LaAlO$_3$ film and the Si substrate, this layer is observed in white by contrast. However, it is not found in FIG. 1, which proves that a direct deposition with no interface layer is achieved.

Thus, the LaAlO$_3$ film in particular is a stable compound at an Si interface and is an insulating film with a high dielectric constant which not only has a nature that makes it difficult for the interface layer to be formed but also has a dielectric constant higher than that of SiO$_2$, such that the LaAlO$_3$ film is a material which can significantly reduce equivalent oxide thickness. This has already been published as a thesis by the present inventors (refer to M. Suzuki et al., Ultra-thin [EOT=3 Å] and Low-leakage Dielectrics of La-Aluminate Directly on Si Substrate Fabricated by High-temperature Deposition. Tech. Dig. IEDM. 2005, pp. 445-448).

Figure 2:
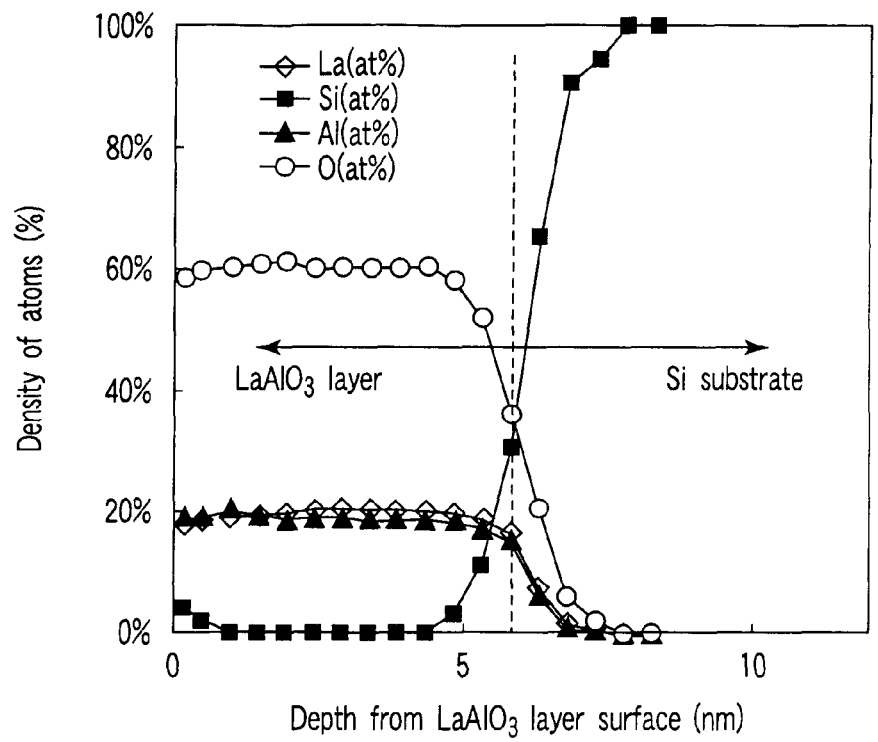
FIG. 2 is a diagram showing the relation between the depth from the surface of a sample in FIG. 1 and the atomic density of constituent elements and showing that no interface layer is formed between the $LaAlO_3$ film and the Si substrate.

FIG. 2 shows the in-depth profiles of elements obtained from a Rutherford backscattering spectroscopy (RBS) analysis. The RBS analysis was conducted under a so-called channeling condition in which He$^+$ ions with an energy of 450 keV irradiated along <111> axis direction. It is observed that the composition within the LaAlO$_3$ film has a stoichiometric ratio, that is, La:Al:O=1:1:3. Moreover, an interface with the Si substrate shows a sharp profile, which means the direct deposition.

Figure 3:
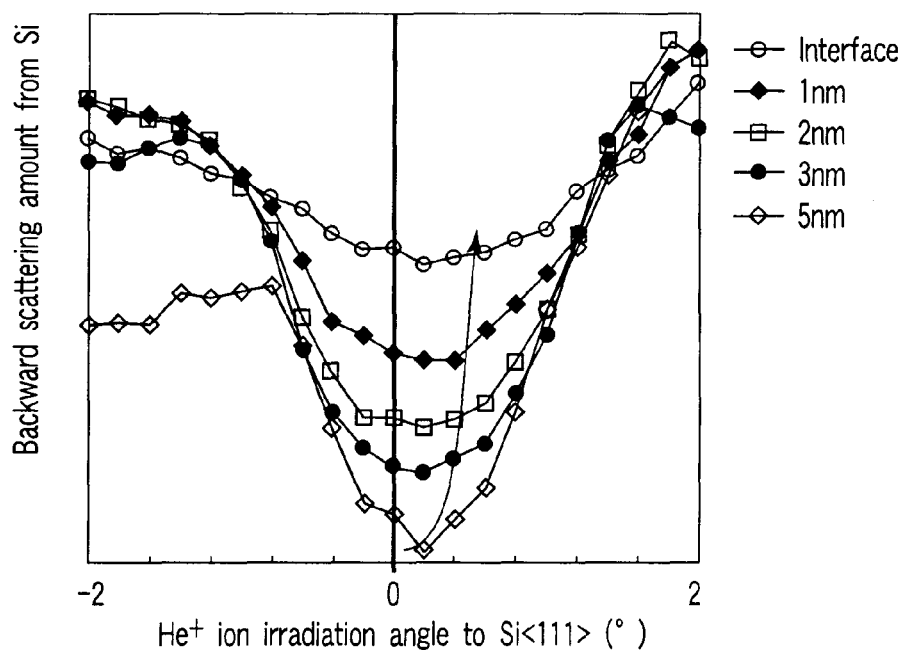
FIG. 3 is a diagram showing the relation between the irradiation angle of He ions and the RBS yields and showing that the substrate has tensile strain.

Here, in order to analyze the strain of the Si substrate, He$^+$ ions with an energy of 450 keV are irradiated to a sample at a step angle of 0.2° within a range of ±2° from an Si<111> axis (54.7° to the normal of the sample surface), and the He$^+$ ions backscattered in the respective irradiation angle conditions are detected by a deflection magnetic field energy analyzer at a position with a scattering angle of 50°. FIG. 3 shows plots of the yield of backscattering from Si at an interface, and at positions 1, 2, 3 and 5 nm deep from the interface with respect to the irradiation angles of the He$^+$ ions.

When the He$^+$ ions are irradiated, the backscattering yield decreases due to channeling effects if the He$^+$ ions are irradiated along the crystal axis of Si. That is, in this measurement, the yield of backscattering from Si is minimized in the <111> axis (i.e., when zero on the horizontal axis) in the case of an Si substrate which is not strained.

On the other hand, it is known that the minimum value of the backscattering yield shifts toward the positive angle from the <111> axis when the Si substrate has tensile strain while the minimum value shifts toward the negative angle when the Si substrate has compressive strain. This proves that the tensile strain is applied to the substrate in the case of the current direct deposition because the minimum value has shifted toward the positive angle. It can be seen that the strain increases as the interface becomes closer.

Figure 4:
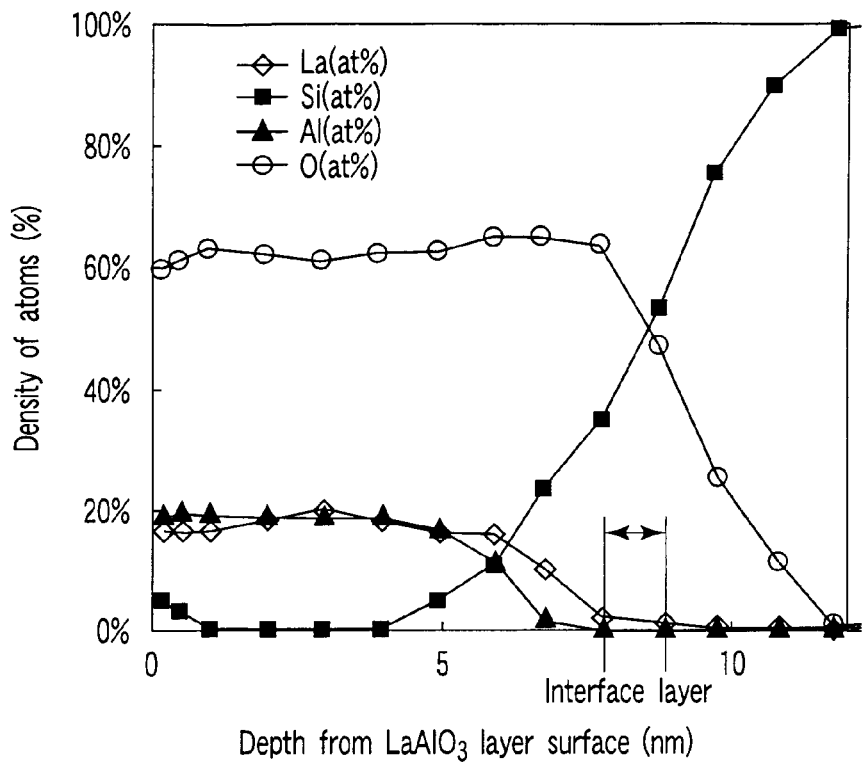
FIG. 4 is a diagram showing the relation between the depth from the surface of the sample and the atomic density of the constituent elements when a thermal treatment in oxygen is carried out and showing that an interface layer is formed between the $LaAlO_3$ film and the Si substrate.

FIG. 4 shows in-depth profiles in accordance with the RBS after the film shown in FIG. 1 is thermally treated in an oxygen atmosphere at 600° C. for 30 minutes. In FIG. 4, there is an area of about 1 nm in the vicinity of the interface where Si and oxygen alone exist (this is indicated as an interface layer in FIG. 4). This shows that the Si substrate has been oxidized and the interface layer made of SiO$_2$ has grown due to the thermal treatment in the oxygen atmosphere.

Figure 5:
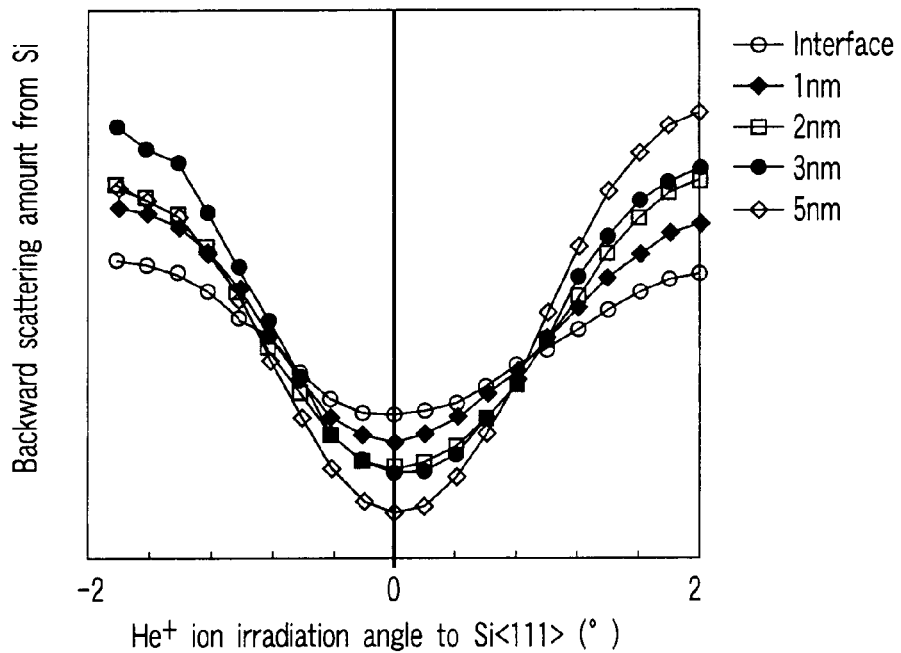
FIG. 5 is a diagram showing the relation between the irradiation angle of He ions and the RBS yields when the interface layer is formed and showing that there is almost no strain.

In FIG. 5, the yields of backscattering from Si in the sample after the oxygen thermal treatment with respect to the irradiation angle of the He$^+$ ions are plotted for the positions at the respective depths as in FIG. 3. It is recognized from the comparison with FIG. 3 that almost no strain is applied in the case where the interface layer is present because the minimum values of curves substantially correspond to the <111> axis (an irradiation angle of zero).

Furthermore, the amount of strain is calculated by the following equation from the extent of deviation of the minimum values of the curves shown in FIGS. 3 and 5 from the <111> axis.

$$\epsilon = 2\Delta\theta/\sin 2\theta \tag{1}$$

where $\epsilon$ indicates the amount of strain, $\Delta\theta$ indicates the amount of the angle of the deviation from the <111> axis, and $\theta$ indicates the <111> axis, that is, 54.7° here.

Figure 6:
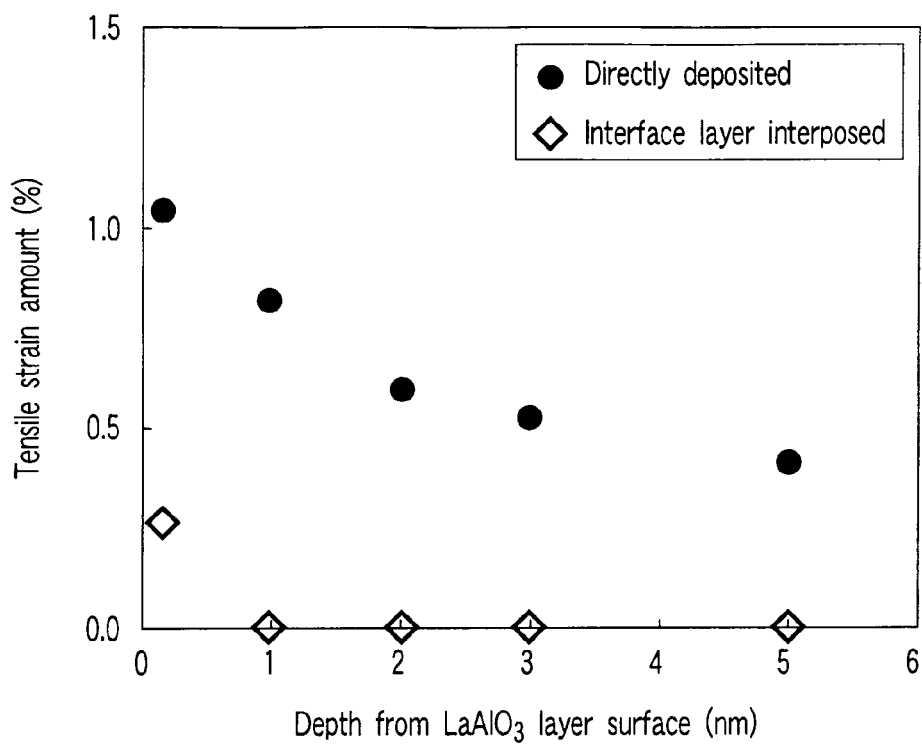
FIG. 6 is a diagram showing the relation between the depth from the interface and the amount of tensile strain and showing the difference in the amount of tensile strain depending on the presence of the interface layer.

FIG. 6 shows the in-depth profiles of the strain amounts obtained by the above equation. It shows that strain of 0.5% or more is applied in areas up to 3 nm from the interface and that there is almost no strain, on the other hand, in the case where the interface layer is present. As it is known that the strain is not dependent on the thickness of the SiO$_2$ layer which is the interface layer, it can be said from this result that almost no Si strain is applied as long as the interface is formed by an Si—O—Si bond.

Furthermore, it can also be seen that tensile strain of 0.8% or more is contained in an area in the Si substrate within at least 1 nm from the interface with the SiO$_2$ layer and that tensile strain of less than 0.5% is contained in an area in the Si substrate deeper than at least 3 nm from the interface with the SiO$_2$ layer.

It can be said from what mentioned above that the great strain amount in the case of the direct deposition shown in FIG. 6 is attributed to the direct deposition of LaAlO$_3$. More specifically, this is considered to be attributed to the fact that Si and La that are greatly different in atomic radius form the La—O—Si bond at the deposition interface. As this strain amount is determined by the bonding of atoms, it is a universal strain amount which is not dependent on the size of a transistor as well as the thickness of the LaAlO$_3$ film, more specifically, not dependent on the area of Si serving as a channel. Thus, the insulating film which is stable at the Si interface and which contains La having an atomic radius greatly different from that of Si is directly deposited on the Si substrate, such that the mobility is improved in an n-channel MOS transistor requiring the tensile strain.

Furthermore, the direct deposition is disadvantageous to the improvement of the mobility in a p-channel MOS transistor requiring compressive strain, but this can be solved if one or more atomic layer of SiO$_2$ is provided at the interface. Further, if a known technique for applying the compressive strain is used, it is possible to provide a structure capable of improving the mobility in both the n- and p-channel MOS transistors.

Hereinafter, the embodiments of the present invention will be described with reference to the drawings. It is to be noted that the present invention is not limited to the embodiments described below and various modifications can be made without departing from the spirit of the invention.

First Embodiment

Figure 7:
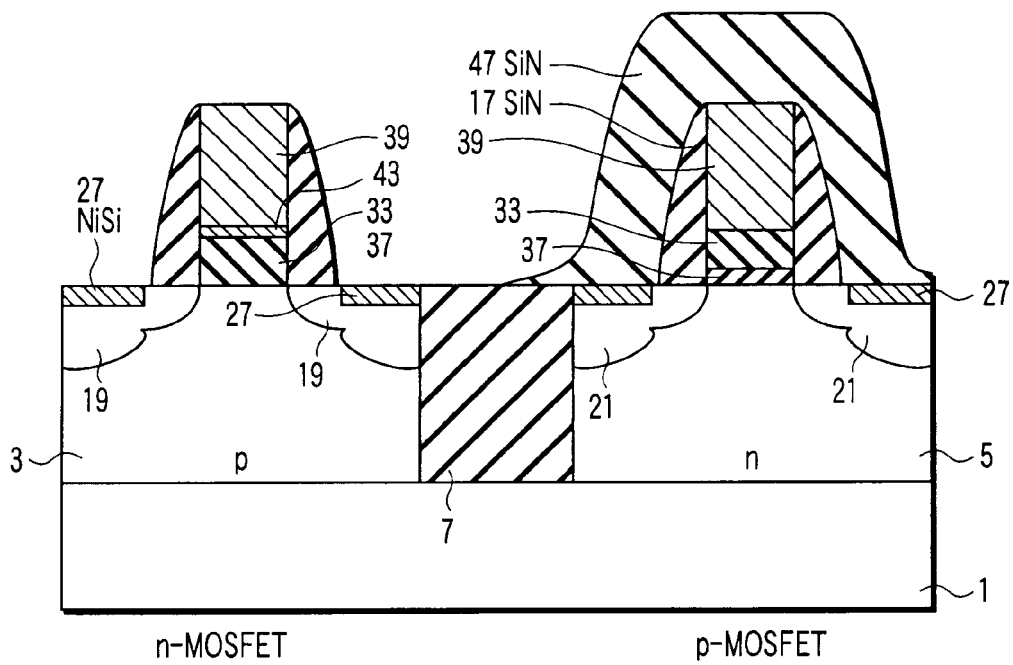
FIG. 7 is a sectional view of a semiconductor device according to the first embodiment.

FIG. 7 is a sectional view showing the configuration of a complementary MOS (CMOS) transistor according to a first embodiment. A p-type semiconductor layer 3 and an n-type semiconductor layer 5 are formed on an Si substrate 1 via an isolation layer 7 made of $SiO_2$. In addition, a substrate having a silicon on insulator (SOI) structure may be used. Moreover, the n-type semiconductor layer 5 may be an SiGe layer. In this case, the SiGe layer has to have an atomic ratio of Ge of 10% or more in order to contain strain that achieves high mobility, and has to have a Ge concentration of 20% or less in order to attain an amount of defects which does not influence transistor characteristics.

An n-channel MOS transistor is formed on the p-type semiconductor layer, and a p-channel MOS transistor is formed on the n-type semiconductor layer. In the n-channel MOS transistor, an amorphous $LaAlO_3$ film having a dielectric constant higher than that of Si is directly deposited as a gate insulating film on the p-type semiconductor layer without having any interface layer, and the Si substrate serving as a channel has a tensile strain of 0.5 to 1% in an area up to at least 3 nm from the interface. At this point, the thickness of the $LaAlO_3$ film can be freely changed in accordance with the application of the device.

A gate electrode made of segregated Al and $Ni_2Si$ is formed on the $LaAlO_3$ film. The configuration of the gate electrode is not limited to this, and the composition and material can be freely selected to provide a threshold voltage conforming to the use of the device.

Source/drain areas are formed across a channel area immediately under the gate insulating film of the n-channel MOS transistor. Here, tensile strain due to the $LaAlO_3$ film is applied to the channel portion. A gate sidewall made of SiN is formed around the gate insulating film and the gate electrode.

In the p-channel MOS transistor, one atomic layer of $SiO_2$ is formed as an interface layer on the n-type semiconductor layer, on which the $LaAlO_3$ film is further formed. At this point, the thickness of the $SiO_2$ layer and the $LaAlO_3$ film can be freely changed to conform to various devices.

$Ni_2Si$ is formed as a gate electrode on the $LaAlO_3$ film, and a gate sidewall insulating film made of SiN is formed around the gate insulating film and the gate electrode that are made of the $SiO_2$ layer and the $LaAlO_3$ layer. The configuration of the gate electrode is not limited to this in the p-channel MOS transistor as well, and its material can be freely selected in accordance with the application of the device.

Furthermore, an SiN film which is a stressor is formed on the gate sidewall insulating film and the gate electrode to cover these layers. Source/drain areas are formed across a channel area immediately under the $SiO_2$ interface layer. Here, in the channel area, tensile strain caused by the $LaAlO_3$ film is relaxed due to $SiO_2$, and compressive strain is applied by the deposition of the SiN film which is the stressor.

Moreover, the $SiO_2$ layer at the interface may be eliminated when the effect of the stressor is great and the tensile strain in the case where the $LaAlO_3$ film is directly deposited can be counteracted. According to the first embodiment, greater improvement of the mobility can be made in both the n- and p-channel MOS transistors owing to the application of the optimum strains than when there is no strain.

Next, the process of manufacturing a semiconductor device in the first embodiment will be described. First, as shown in FIG. 8, the p-type semiconductor layer 3 and the n-type semiconductor layer 5 are formed on the semiconductor substrate 1 by, for example, an ion implantation method. Then, the isolation layer 7 made of a silicon oxide layer is formed on the surface of the boundary between the p-type semiconductor layer 3 and the n-type semiconductor layer 5.

Subsequently, as shown in FIG. 9, for example, $SiO_2$ and polycrystalline Si are deposited as a dummy gate insulating film 9 and a dummy gate electrode 11 on the p-type semiconductor layer 3 and the n-type semiconductor layer 5. Then, as shown in FIG. 10, the $SiO_2$ layer 9 and the polycrystalline Si layer 11 are processed using a known etching technique such as RIE to form dummy gate electrodes.

Then, n-type impurities and p-type impurities are ion-implanted into an nMOS transistor area and a pMOS transistor area by a known method using the dummy gate electrodes 11 as masks, thereby forming diffusion layers 13, 15 serving as the source/drain. It goes without saying that when ions are implanted into the FET on one side, the FET on the other side is masked with a resist (not shown).

Figure 12:
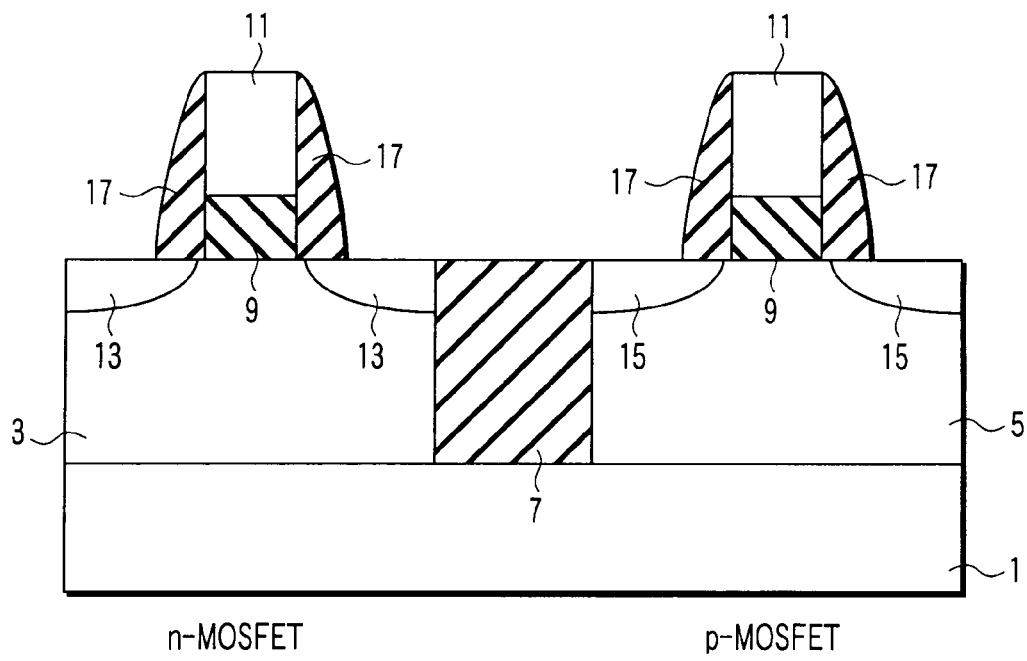
Figure 13:
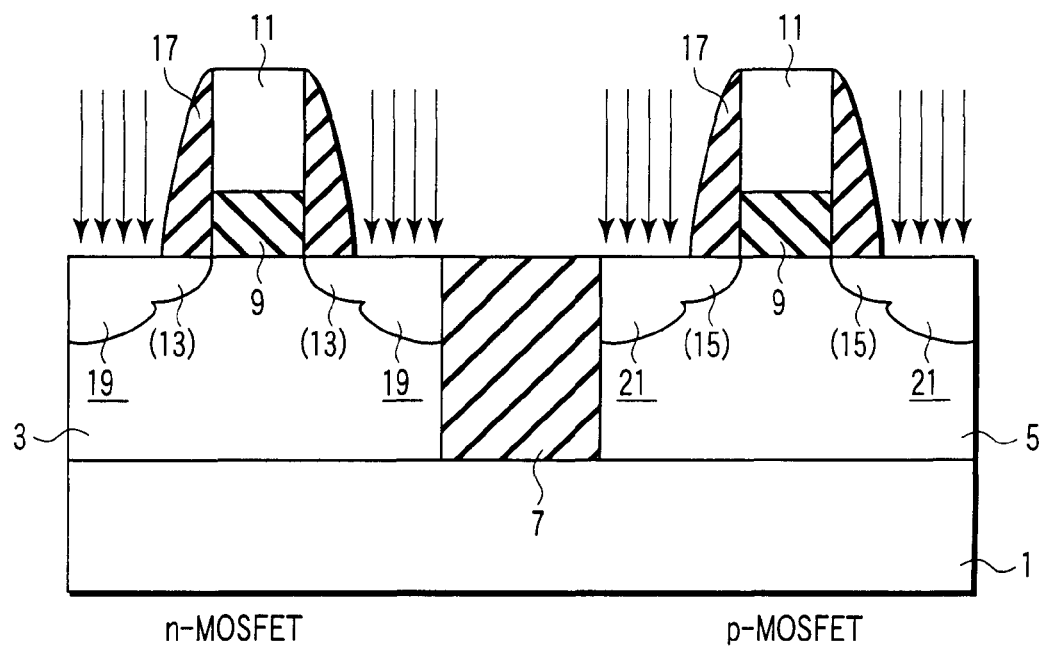
Figure 14:
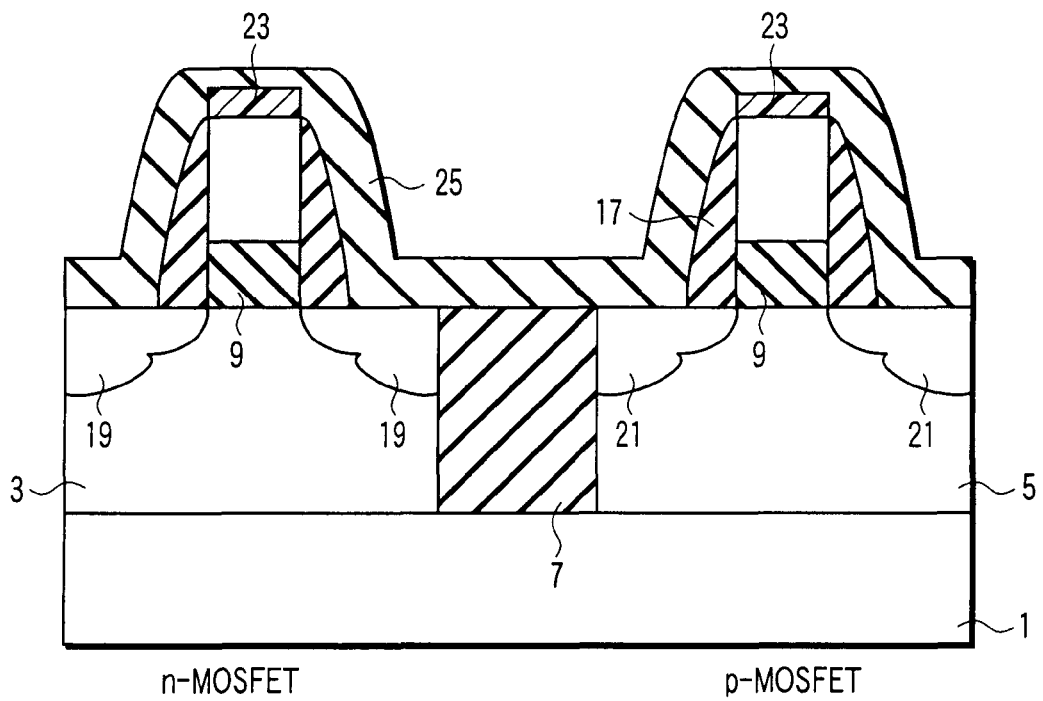

Subsequently, an SiN layer is deposited on the entire surface by a known method, and etched by RIE, thereby forming gate sidewalls 17, as shown in FIG. 12. Then, n-type impurities and p-type impurities are ion-implanted into the n-channel MOS transistor area and the p-channel MOS transistor area using the dummy gate electrodes 11 and the gate sidewalls 17 as masks, and a thermal treatment is performed for activation, thereby forming source/drain areas 19, 21 including the shallow extension source/drain portions 13, 15, as shown in FIG. 13.

A selective epitaxial growth method may be used for the formation of the extension portions 13, 15, and an elevated source/drain structure may be used which can suppress a short channel effect in terms of the device characteristics. Moreover, impurities may be introduced simultaneously with the formation of the elevated source/drain structure.

Figure 15:
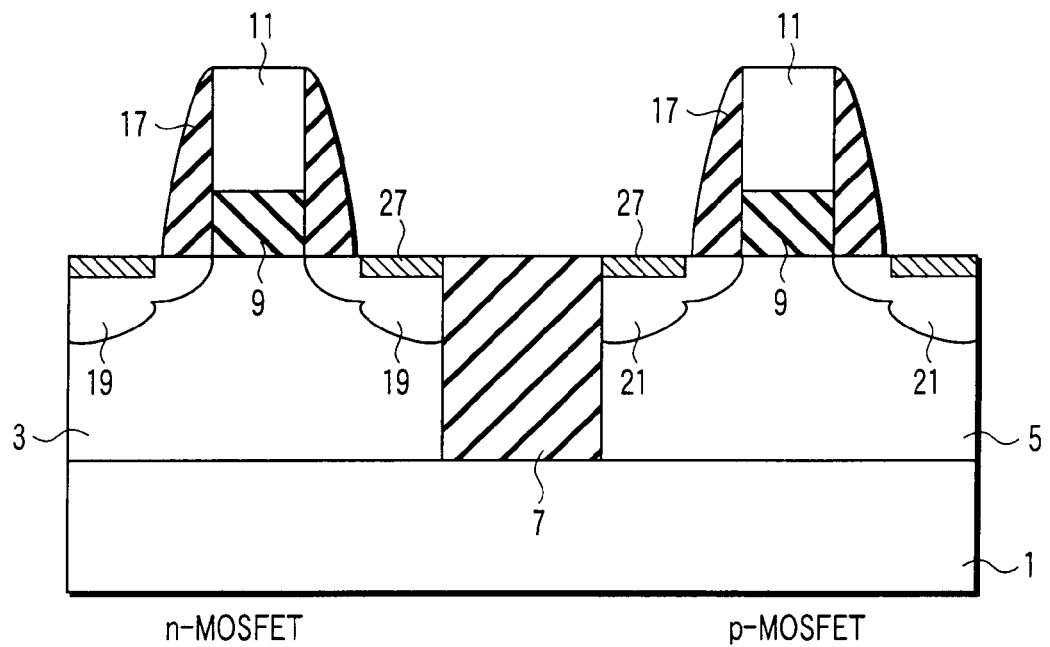

Next, the tops of the gate electrodes 11 are masked with resists 23 by a photo engraving process (PEP). Then, an Ni layer 25 is deposited at about 10 nm on the entire surface by a known method such as a sputtering method. Then, Ni is made to react with Si by a thermal treatment at about 400° C., and then unreacted Ni and the resists 23 on the gate electrodes 11 are removed by, for example, a chemical solution, thereby forming NiSi layers 27 as contacts on the surfaces of the source/drain areas 19, 21, as shown in FIG. 15. The surfaces of the source/drain areas have only to be metal silicide formed by the thermal treatment in a self-aligning manner, such as CoSi. Moreover, conditions of the thermal treatment in the above-mentioned silicidation can be suitably changed.

Figure 16:
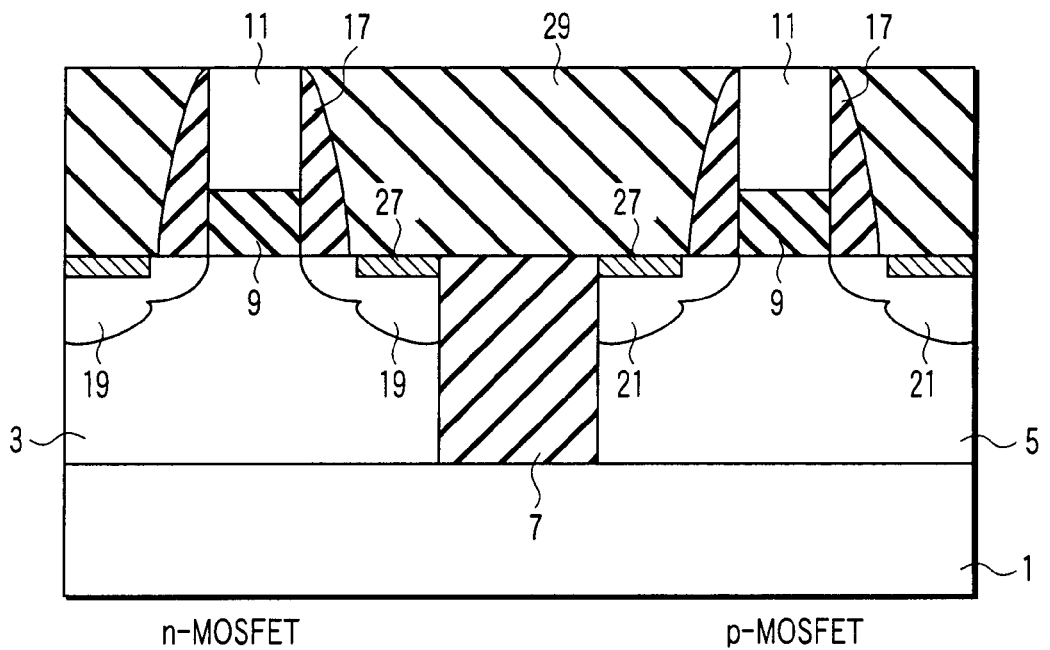

Then, after forming an interlayer insulating film 29 made of $SiO_2$, its surface is planarized by, for example, a chemical mechanical polishing (CMP) method, thereby exposing the surfaces of the gate electrodes 11, as shown in FIG. 16. Then, the gate electrodes 11 are selectively removed by, for example, chemical dry etching (CDE) using $CF_4$ etching gas, and then the dummy gate insulating films 9 are dissolved and removed by hydrofluoric acid, thereby forming gate embedding trenches 31, as shown in FIG. 17.

Figure 17:
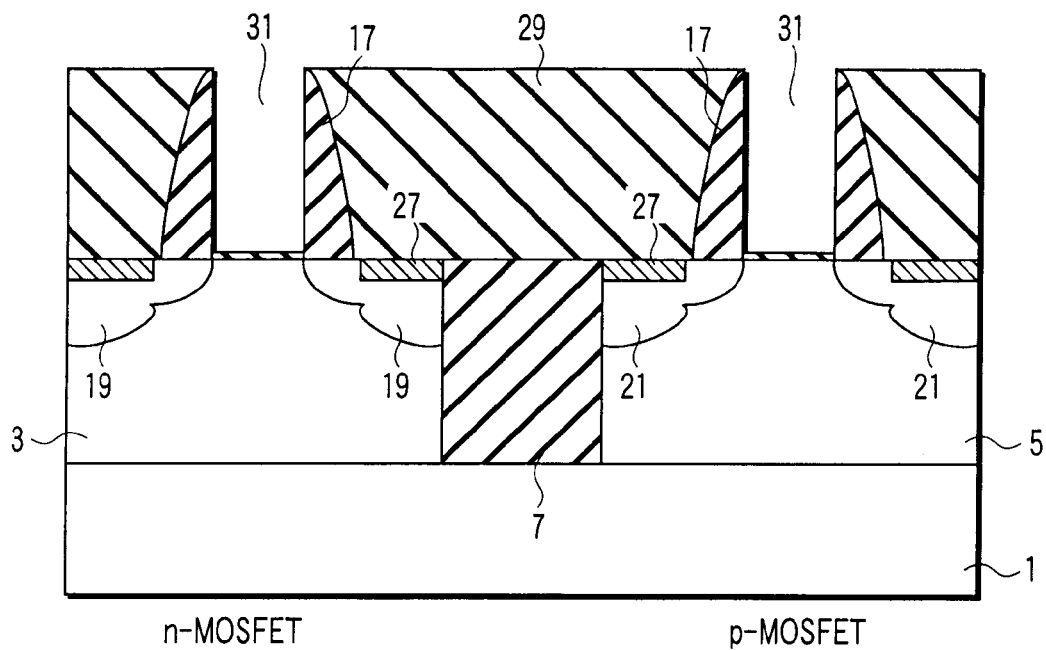

Next, amorphous $LaAlO_3$ films are formed as gate insulating films 33 with a thickness of about 3 nm at the bottoms of the gate embedding trenches 31 as shown in FIG. 17 without forming any interface layer, by a sputtering method using an LaAlO$_3$ single crystal as a target at the substrate temperature of 600° C. in a vacuum (1×10$^{-6}$ Pa).

It is to be noted that the film formation method is not limited to the sputtering method, and a chemical vapor deposition (CVD) method, a molecular beam epitaxy (MBE) method, the laser ablation method, etc. may be used. Moreover, the ratio of La, Al can be suitably changed with regard to the constitution of the gate insulating film 33. In addition, an insulating film containing La such as La$_2$O$_3$, LaSiO or LaHfO may be used as the gate insulating film 33.

Figure 19:
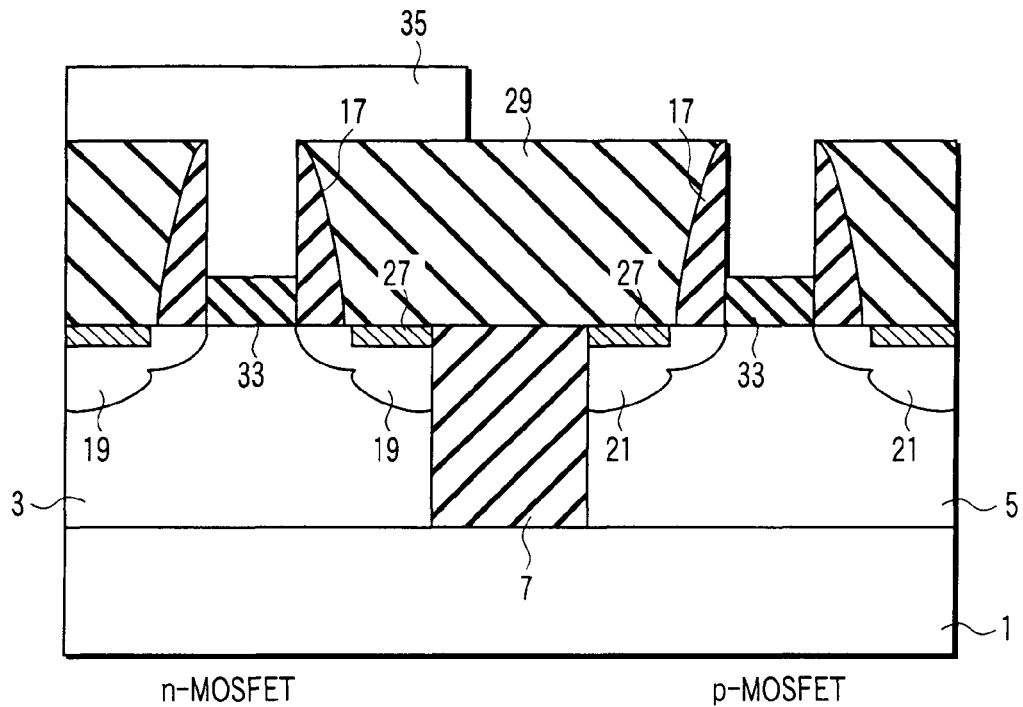
Figure 20:
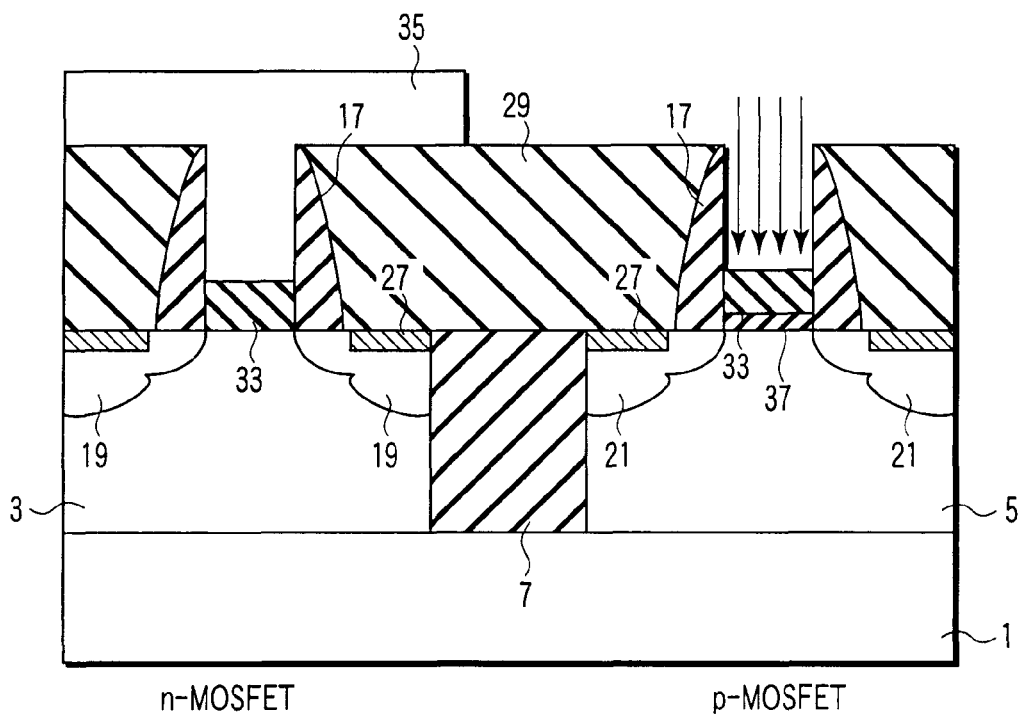

Then, Si having a thickness of, for example, 50 nm is formed on the entire surface by, for example, the CVD method, and Si thus formed is then patterned by the PEP, thereby forming a mask material 35 made of Si on the n-channel MOS transistor area, as shown in FIG. 19. Here, a thermal treatment is performed at 600° C. in the atmospheric oxygen, such that a SiO$_2$ layer 37 serving as an interface layer is formed at a thickness of 0.2 to 2 nm (about one to ten atomic layers) between the substrate and LaAlO$_3$ in the p-channel MOS transistor area alone, as shown in FIG. 20. The conditions of the thermal treatment and the thickness of the interface layer here can be freely set in accordance with the application of the device.

Figure 21:
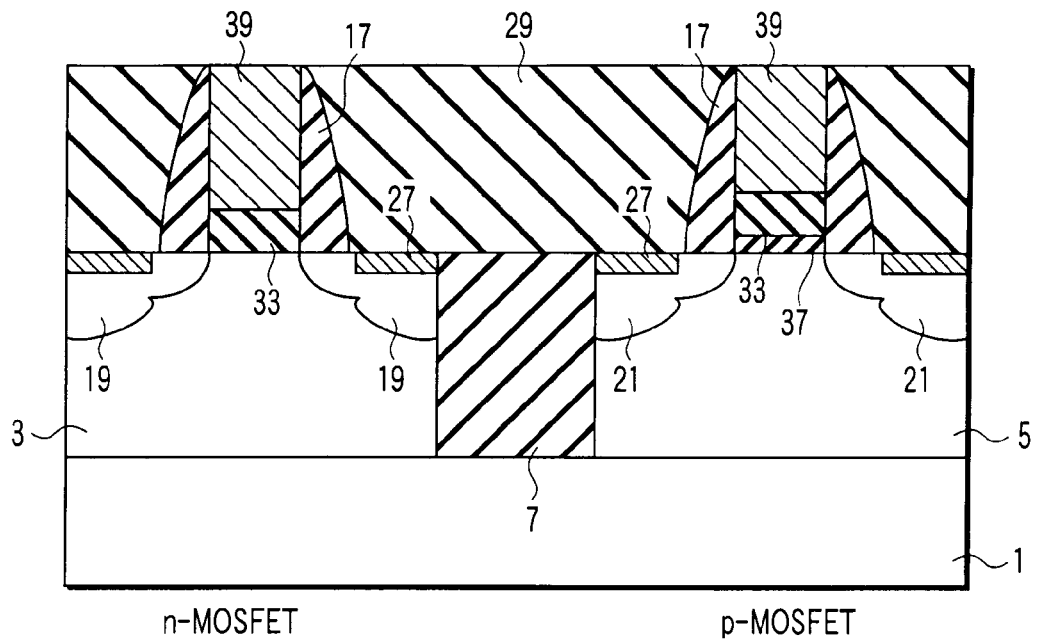

Next, the mask material 35 formed on the n-type MOS transistor area is removed. The combination of the mask material 35 and a material for removing this mask material are not limited as long as similar effects can be provided. Then, polycrystalline Si and Ni are deposited on the LaAlO$_3$ films 33 in the gate embedding trenches and thermally treated, thereby forming Ni$_2$Si layers 39, as shown in FIG. 21.

Figure 22:
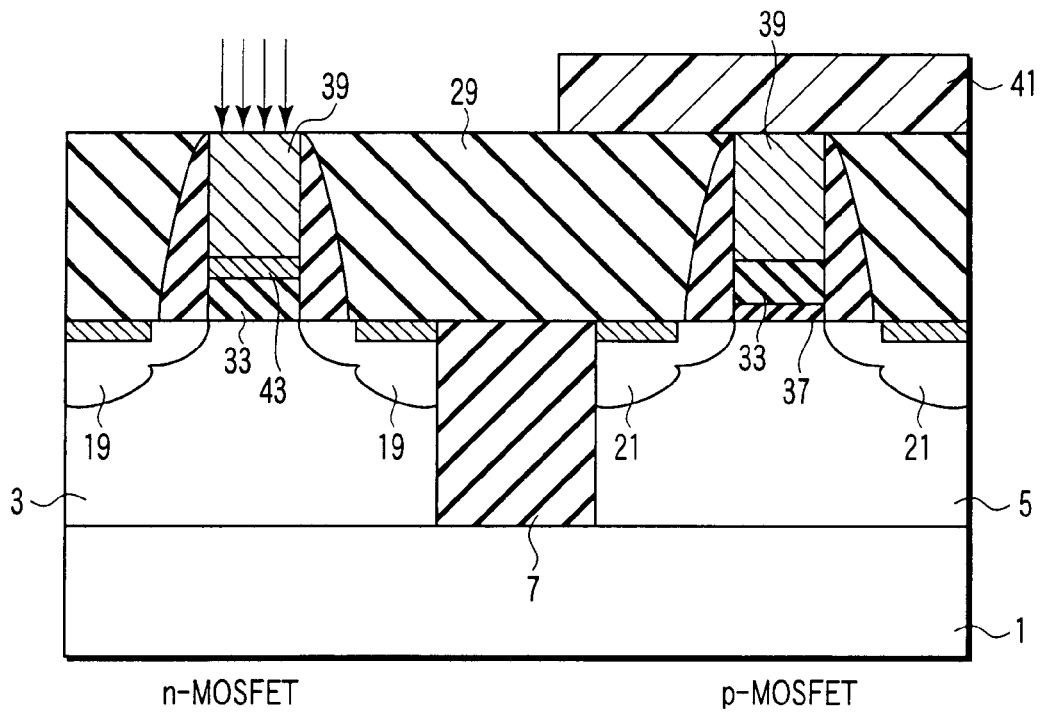

Then, the p-channel MOS transistor area is masked with a resist 41, and Al is ion-implanted from above the gate electrode 39 of the n-channel MOS transistor as shown in FIG. 22, and then Al is segregated at the interface between the gate electrode 39 and the gate insulating film 33 by the subsequent thermal treatment, thereby forming a segregation layer 43. This Al segregation layer 43 is formed to adjust the work function of the gate electrode in the n-channel MOS transistor. Although the combination of the conditions of the ion implantation and the conditions of the subsequent thermal treatment can be arbitrarily set to enable the segregation of Al, at least the LaAlO$_3$ film has to be amorphous in order to segregate Al at the interface without the diffusion of Al in the LaAlO$_3$ film. Moreover, the Al film may be deposited on the Ni$_2$Si layer 39 instead of the ion implantation.

Next, the interlayer insulating film 29 in the p-channel MOS transistor area is removed using the known PEP technique as shown in FIG. 23, thereby forming a resist mask 45 on the n-channel MOS transistor area. Further, an SiN layer 47 of 100 nm is formed on the entire surface by, for example, the CVD method as a stressor for the compressive strain in the p-channel MOS transistor area. The stressor is not limited in the material and thickness as long as it provides compressive strain to the substrate. Then, the resist 45 is lifted off to remove the SiN layer 47 on the n-channel MOS transistor area. Thus, a CMOS transistor as shown in FIG. 24 is formed.

According to the first embodiment described above, the gate insulating film 33 with a high dielectric constant is directly deposited onto the p-type semiconductor layer 3 without forming the interface layer in the n-channel MOS transistor, such that the tensile strain can be introduced into Si in the p-type semiconductor layer 3. Moreover, in the p-channel MOS transistor, an Si channel having compressive strain can be easily formed using a known technique, such that it is possible to provide a complementary MOS transistor having good mobility.

Second Embodiment

In a second embodiment, a MOS transistor having Schottky source/drain made of silicide and the process of manufacturing this MOS transistor will be described. To make it easy to understand, the same reference signs are assigned to the same parts as those in the first embodiment, and redundant explanations are omitted.

Figure 25:
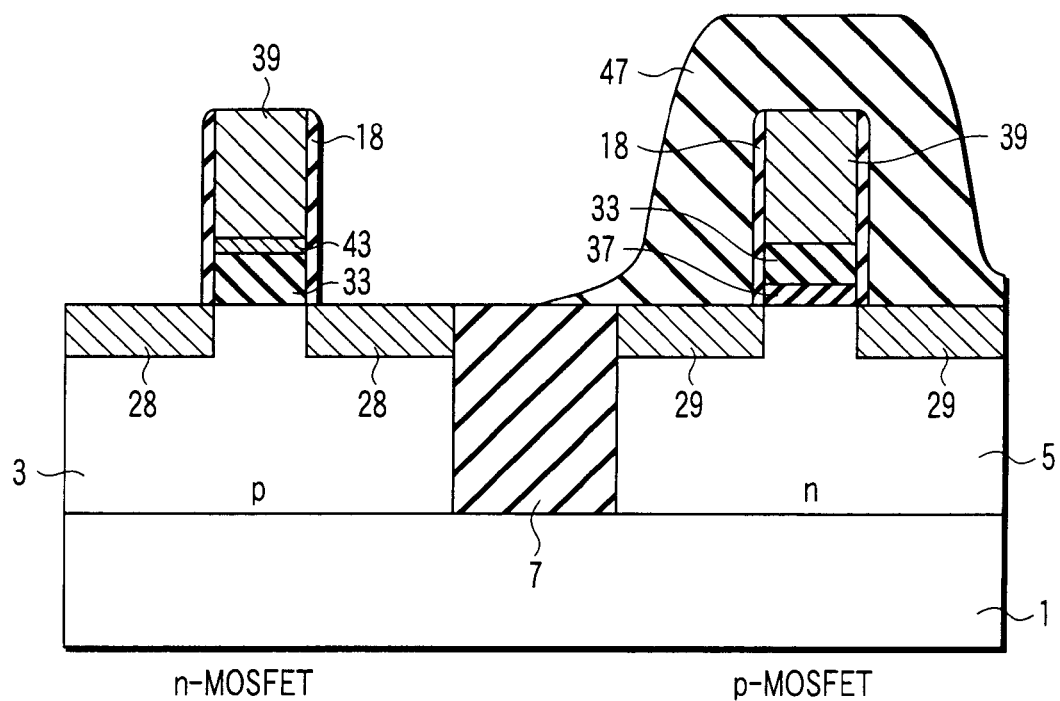
FIG. 25 is a sectional view of a semiconductor device according to the second embodiment.

FIG. 25 is a sectional view showing the configuration of a semiconductor device (CMOS transistor) according to the second embodiment. A p-type semiconductor layer 3 and an n-type semiconductor layer 5 are formed on an Si substrate 1 via an isolation layer 7 made of SiO$_2$. In addition, a substrate having a silicon on insulator (SOI) structure may be used. An n-channel MOS transistor is formed on the p-type semiconductor layer, and a p-channel MOS transistor is formed on the n-type semiconductor layer.

The second embodiment is different from the first embodiment in that source/drain layers have Schottky sources/drains 28, 29 made of CoSi. The second embodiment is similar to the first embodiment in other respects, so that the explanation of the structure is omitted and a manufacturing method will be described.

Figure 26:
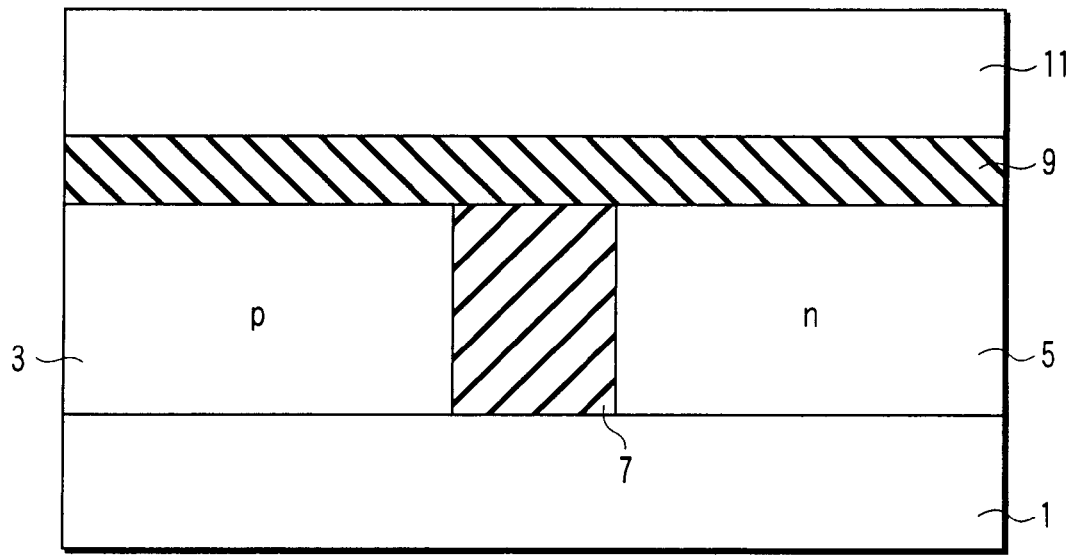

First, as in FIG. 8 in the first embodiment, the isolation layer 7 made of a silicon oxide layer is formed on the boundary between the p-type semiconductor layer 3 and the n-type semiconductor layer 5, and then an amorphous LaAlO$_3$ film 9 is deposited at a thickness of about 3 nm as a gate insulating film using a known method such as the CVD method or the sputtering method without forming any interface layer, as shown in FIG. 26. Then, a polycrystalline Si layer 11 is formed on the LaAlO$_3$ film 9 by, for example, the CVD method.

Subsequently, as shown in FIG. 27, the LaAlO$_3$ film 9 and the polycrystalline Si layer 11 are processed using a known etching technique such as the RIE to form dummy gate electrodes. Then, gate sidewall insulating films 18 made of SiN are formed by, for example, the CVD method, and etched by, for example, the known RIE method to reduce its thickness. Then, the dummy gate electrodes are masked with resists (not shown), and Co is deposited at about 15 nm on the entire surface by, for example, the sputtering method.

Then, CoSi layers 28 are formed in the source/drain areas by a thermal treatment process at 600° C. as shown in FIG. 28, and then unreacted Co and the resist are removed by, for example, a drug solution, thereby silicidating the source/drain areas. At this point, a metal such as Ni may be used for the silicidation instead of Co.

Figure 18:
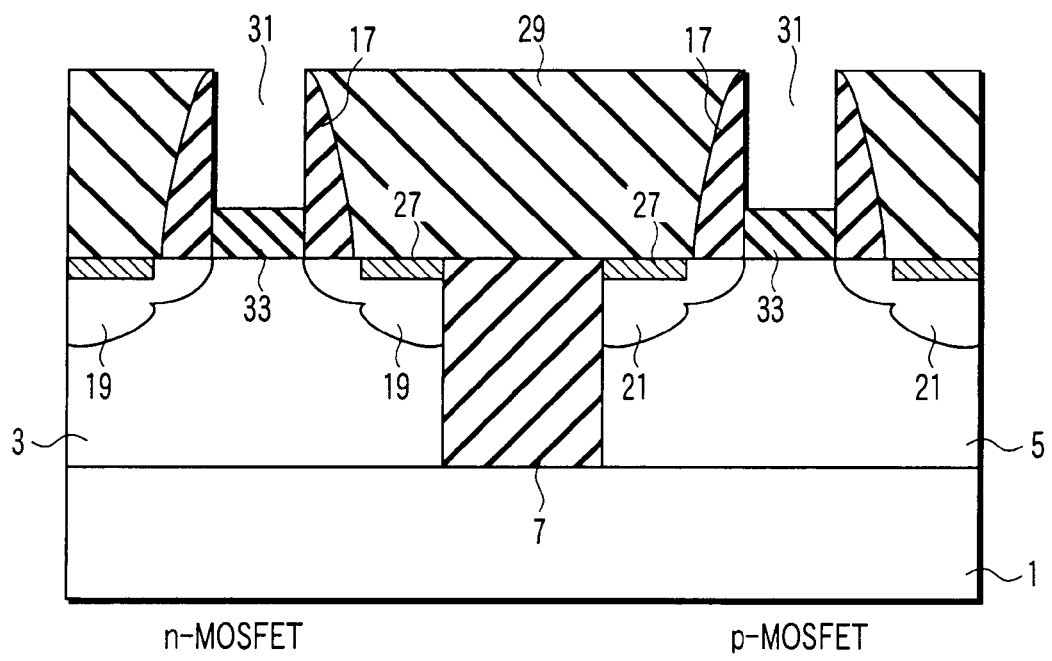
Figure 29:
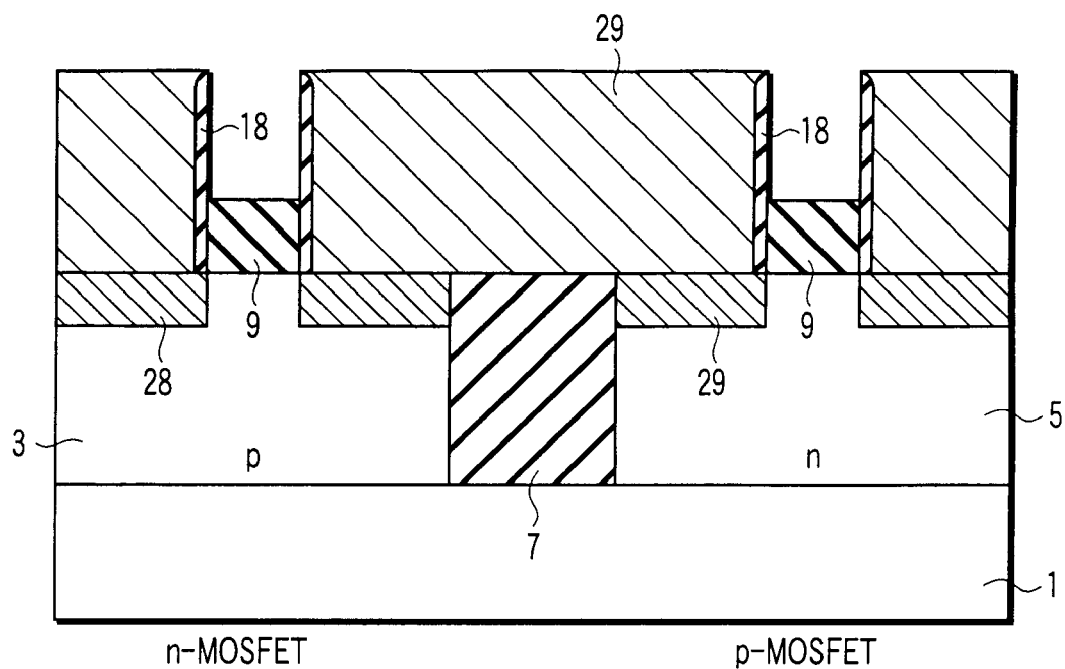

Next, after forming an interlayer insulating film 29 by a known method, the polycrystalline Si layer 11 which is the dummy gate electrode is removed, as shown in FIG. 29. The subsequent steps are similar to those after FIG. 18 in the first embodiment.

According to the second embodiment, as in the first embodiment, a gate insulating film 33 with a high dielectric constant is directly deposited on the p-type semiconductor layer 3 without forming the interface layer in the n-channel MOS transistor, such that the tensile strain can be introduced into Si in the p-type semiconductor layer 3. Moreover, owing to the Schottky source/drain structure, it is possible to provide a complementary MOS transistor with suppressed parasitic resistance and with good performance.

In addition, as in the first embodiment, the semiconductor areas 3, 5 can be made of SiGe (the composition ratio of Ge is 10% or more and 20% or less) in the second embodiment.

Third Embodiment

In a third embodiment, there will be described a semiconductor device having as stressors SiGe layers epitaxially grown in source/drain areas of a p-type MOS transistor, and the process of manufacturing this semiconductor device. To make it easy to understand, the same reference signs are assigned to the same parts as those in the first embodiment, and redundant explanations are omitted.

Figure 30:
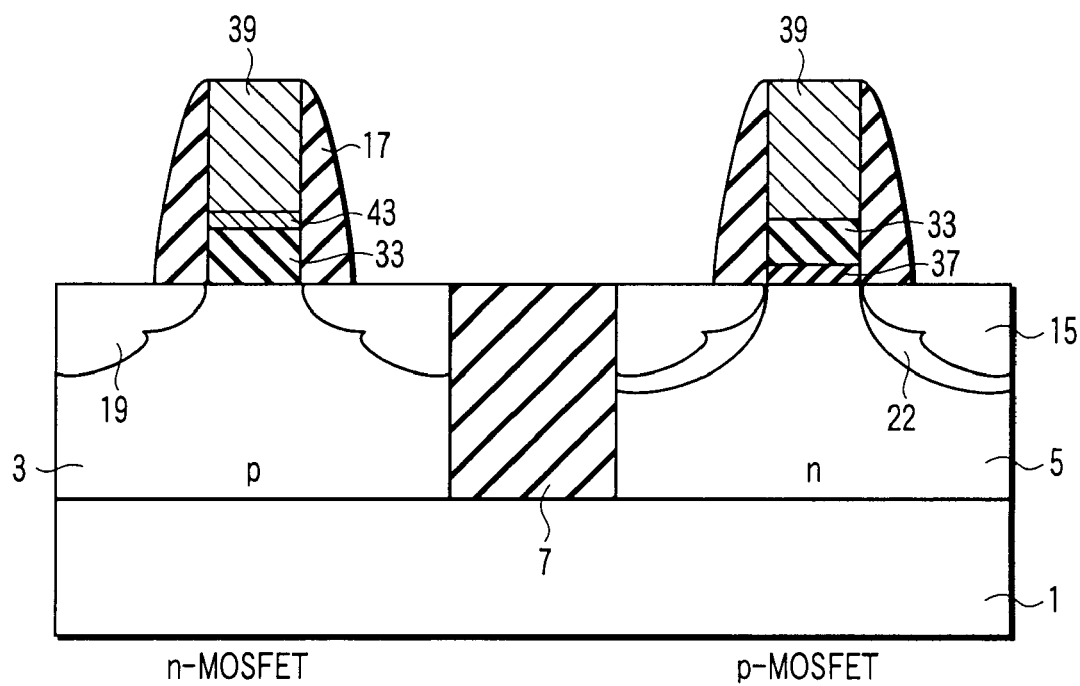
FIG. 30 is a sectional view of a semiconductor device according to the third embodiment.

FIG. 30 is a sectional view showing the configuration of a semiconductor device (CMOS transistor) according to the third embodiment. A p-type semiconductor layer 3 and an n-type semiconductor layer 5 are formed on an Si substrate 1 via an isolation layer 7 made of SiO$_2$. In addition, a substrate having an SOI structure may be used. An n-channel MOS transistor is formed on the p-type semiconductor layer, and a p-channel MOS transistor is formed on the n-type semiconductor layer.

The third embodiment is different from the first embodiment in that the epitaxially grown SiGe layers are provided as stressors in the source/drain of the p-channel MOS transistor. The third embodiment is similar to the first embodiment in other respects, so that the explanation of the structure is omitted and a manufacturing method will be described.

Figure 11:
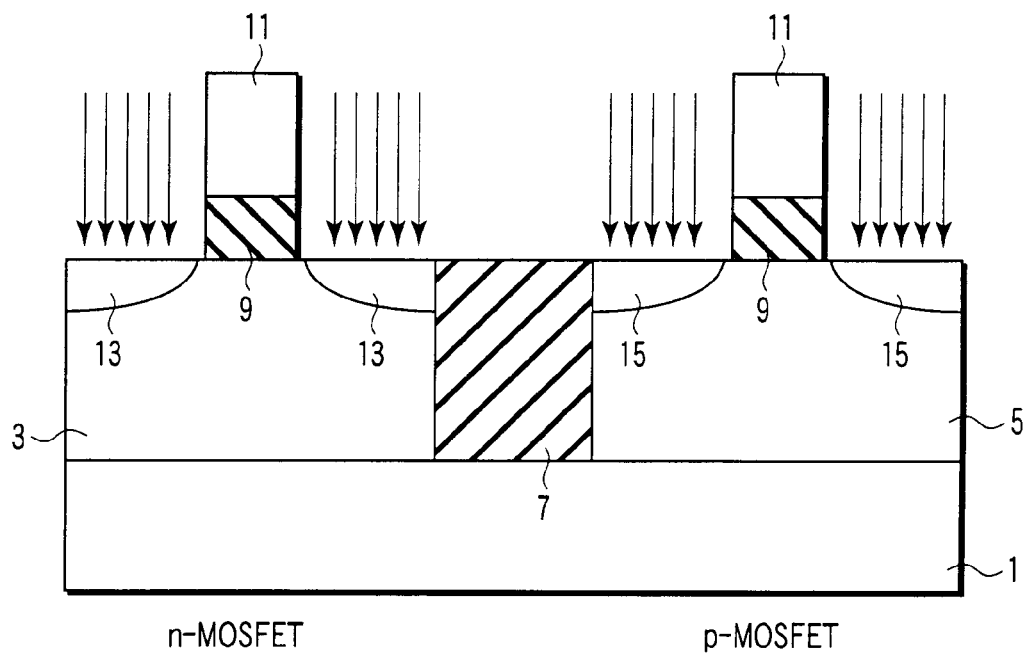

First, after the processing of a dummy gate electrode 11 and a gate insulating film 9 as in FIGS. 9 and 10 in the first embodiment, the p-channel MOS transistor area is masked with a resist (not shown) as in FIG. 11, and then n-type impurities are ion-implanted into the n-channel MOS transistor area using the dummy gate electrode 11 as a mask, thereby forming source/drain diffusion layers 13 which are extension areas.

Then, after the resist in the p-channel MOS transistor area is removed, the n-channel MOS transistor is masked with a resist 14 as shown in FIG. 31, so that the source/drain areas of the p-channel MOS transistor are etched. The depth of this etching should desirably be equal to or more than the distribution of impurities provided by the subsequent ion implantation.

Next, as shown in FIG. 32, SiGe containing Ge at an atomic ratio of 10% is epitaxially grown on the etched areas. At this point, Ge has to be at an atomic ratio of 10% or more in order to apply compressive strain to Si serving as a channel, and the amount of Ge has to be 20% or less in order to attain an amount of defects which does not influence transistor characteristics.

Figure 33:
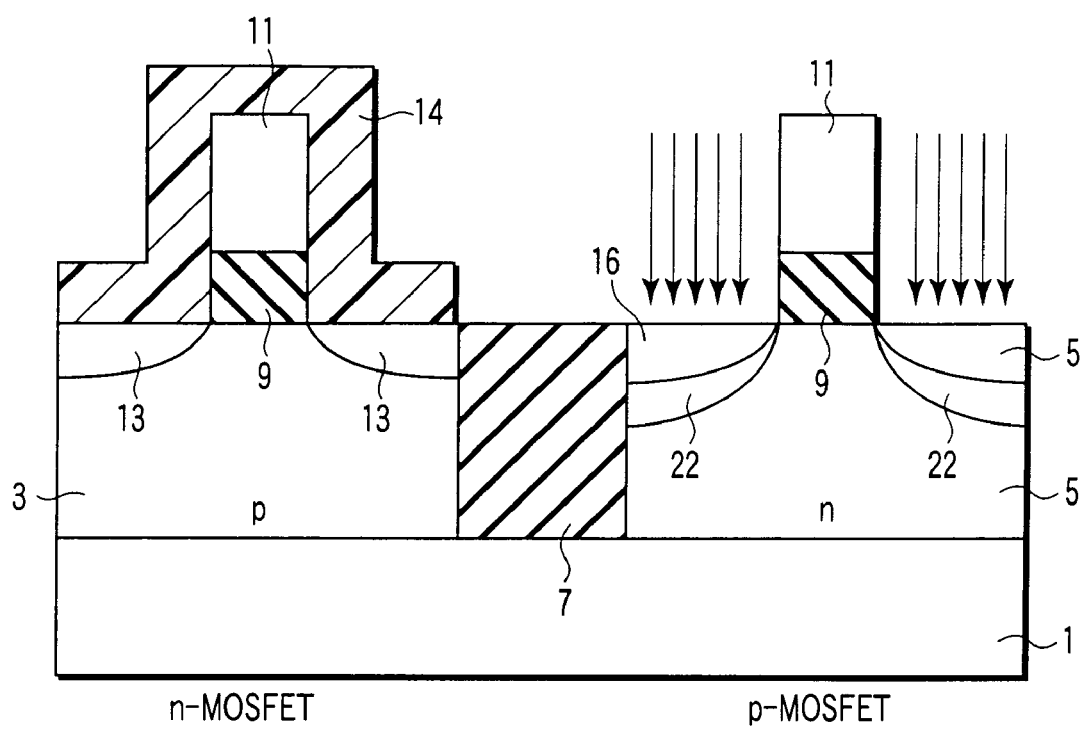

Next, ions are implanted into the p-channel MOS transistor area, so that extension areas 15 of the p-channel MOS transistor are formed, as shown in FIG. 33. Then, the resist 14 on the nMOS transistor is removed. The subsequent steps conform to the steps after FIG. 12 in the first embodiment, but the SiN film which is a stressor for the compressive strain in the first embodiment may be omitted. If this is used together, stronger strain can be provided to the channel areas of the p-channel MOS transistor.

According to the third embodiment, as in the first embodiment, the gate insulating film 33 with a high dielectric constant is directly deposited onto the p-type semiconductor layer 3 without forming the interface layer in the n-channel MOS transistor, such that the tensile strain can be introduced into Si in the p-type semiconductor layer 3. Moreover, in the p-channel MOS transistor area, SiGe layers 22 are provided as the stressor, the compressive strain can be provided to the Si channel as in the first embodiment.

As described above, according to the present invention, it is possible to provide a complementary MOS transistor capable of applying to the channel of the n-channel MOS transistor tensile strain which is not dependent on the size of the transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a p-type first semiconductor region formed on the semiconductor substrate;
an n-type second semiconductor region formed on the semiconductor substrate so as to be insulated from the first semiconductor region;
an n-channel MOS transistor formed on the first semiconductor region; and
a p-channel MOS transistor formed on the second semiconductor region,
the n-channel MOS transistor including:
a first pair of source/drain regions formed opposite to each other on the first semiconductor region;
a first gate insulating film formed from a single layer of an amorphous insulating film containing at least La, and formed in direct contact with the first semiconductor region interposed between the first pair of source/drain regions; and
a first gate electrode formed in direct contact with the first gate insulating film,
the p-channel MOS transistor including:
a second pair of source/drain regions formed opposite to each other on the second semiconductor region;
a second gate insulating film having a stacked structure formed of a silicon oxide film and a second film thereon formed from the amorphous insulating film, the silicon oxide film being formed on the second semiconductor region interposed between the second pair of source/drain regions; and
a second gate electrode formed in direct contact with the second film of the second gate insulating film.

2. The device according to claim 1, wherein the first semiconductor region and the second semiconductor region are formed of either Si or SiGe, an atomic ratio of Ge in the SiGe being between 10% and 20% inclusive.

3. The device according to claim 1, wherein the amorphous insulating film is an LaAlO$_3$ film.

4. The device according to claim 1, wherein the first semiconductor region is formed of Si, and a tensile strain corresponding to a 0.5% or more shift with respect to an intrinsic lattice constant of Si is contained in the first semiconductor region within at least 3 nm from an interface with the first gate insulating film.

5. The device according to claim 1, wherein the first semiconductor region is formed of Si, and a tensile strain corresponding to a 0.8% or more shift with respect to an intrinsic lattice constant of Si is contained in the first semiconductor region within at least 1 nm from an interface with the first gate insulating film; and a tensile strain corresponding to a less than 0.5% shift with respect to an intrinsic lattice constant of Si is contained in the first semiconductor region deeper than at least 3 nm from the interface with the first gate insulating film.

6. The device according to claim 1, wherein the first gate electrode includes a Ni silicide and the amorphous insulating film is an $LaAlO_3$.

7. The device according to claim 1, further comprising a stressor insulating film covering an upper surface and side surfaces of the second gate electrode of the p-channel MOS transistor, so as to apply compressive stress to the second semiconductor region under the second gate insulating film.

8. A semiconductor device comprising:
a semiconductor substrate;
a p-type first semiconductor region formed on the semiconductor substrate;
an n-type second semiconductor region formed on the semiconductor substrate so as to be insulated from the first semiconductor region via an insulating region;
an n-channel MOS transistor formed on the first semiconductor region;
a p-channel MOS transistor formed on the second semiconductor region, and
a stressor insulating film formed only on the p-channel MOS transistor and the insulating region and applying compressive stress to the second semiconductor region,
the n-channel MOS transistor including:
a first pair of source/drain regions formed opposite to each other on the first semiconductor region;
a first gate insulating film formed from a single layer of an amorphous insulating film containing at least La, and formed in direct contact with the first semiconductor region interposed between the first pair of source/drain regions; and
a first gate electrode formed in direct contact with the first gate insulating film,
the p-channel MOS transistor including:
a second pair of source/drain regions formed opposite to each other on the second semiconductor region;
a second gate insulating film having a stacked structure formed of a silicon oxide film and a second film thereon formed from the amorphous insulating film, the silicon oxide film being in direct contact with the second semiconductor region interposed between the second pair of source/drain regions;
a second gate electrode formed in direct contact with the second film of the second gate insulating film.

9. The device according to claim 8, wherein the stressor film is a silicon nitride film.

10. The device according to claim 8, wherein the first semiconductor region and the second semiconductor region are formed of either Si or SiGe, an atomic ratio of Ge in the SiGe being between 10% and 20% inclusive.

11. The device according to claim 8, wherein the amorphous insulating film is an $LaAlO_3$ film.

12. The device according to claim 8, wherein the first semiconductor region is formed of Si, and a tensile strain corresponding to a 0.5% or more shift with respect to an intrinsic lattice constant of Si is contained in the first semiconductor region within at least 3 nm from an interface with the first gate insulating film.

13. The device according to claim 8, wherein the first semiconductor region is formed of Si, and a tensile strain corresponding to a 0.8% or more shift with respect to an intrinsic lattice constant of Si is contained in the first semiconductor region within at least 1 nm from an interface with the first gate insulating film; and a tensile strain of less than 0.5% is contained in the first semiconductor region deeper than at least 3 nm from the interface with the first gate insulating film.

14. The device according to claim 8, wherein the first gate electrode includes a Ni silicide and the amorphous insulating film is an $LaAlO_3$.

15. A semiconductor device comprising: a semiconductor substrate;
a p-type first Si semiconductor region formed on the semiconductor substrate;
an n-type second Si semiconductor region formed on the semiconductor substrate so as to be insulated from the first semiconductor region;
an n-channel MOS transistor formed on the first Si semiconductor region;
a p-channel MOS transistor formed on the second Si semiconductor region,
the n-channel MOS transistor including:
a first pair of source/drain regions formed opposite to each other on the first Si semiconductor region;
a first gate insulting film formed from a single layer of an amorphous insulting film containing at least La, and formed in direct contact with the first Si semiconductor region interposed between the first pair of source/drain regions; and
a first gate electrode formed in direct contact with the first gate insulating film,
the p-channel MOS transistor including:
a second pair of source/drain regions formed opposite to each other on the second semiconductor region and made of SiGe containing Ge at a concentration of between 10% and 20% inclusive in an atomic ratio;
a second gate insulating film having a stacked structure formed of a silicon oxide film and a second film thereon formed from the amorphous insulating film, the silicon oxide film being formed on the second Si semiconductor region interposed between the second pair of source/ drain regions; and
a second gate electrode formed in direct contact with the second film of the second gate insulating film.

16. The device according to claim 15, wherein the amorphous insulating film is an $LaAlO_3$ film.

17. The device according to claim 15, wherein a tensile strain corresponding to a 0.5% or more shift with respect to an intrinsic lattice constant of Si is contained in the first semiconductor region within at least 3 nm from an interface with the first gate insulating film.

18. The device according to claim 15, wherein a tensile strain corresponding to a 0.8% or more shift with respect to an intrinsic lattice constant of Si is contained in the first semiconductor region within at least 1 nm from an interface with the first gate insulating film; and a tensile strain of less than 0.5% is contained in the first semiconductor region deeper than at least 3 nm from the interface with the first gate insulating film.

19. The device according to claim 15, wherein the first gate electrode includes a Ni silicide and the amorphous insulating film is an $LaAlO_3$.

20. The device according to claim 15, further comprising a stressor insulating film covering an upper surface and side surfaces of the second gate electrode of the p-channel MOS transistor, so as to apply compressive stress to the second semiconductor region under the second gate insulating film.

* * * * *